(12) United States Patent
Jones et al.

(10) Patent No.: US 6,841,728 B2
(45) Date of Patent: Jan. 11, 2005

(54) SOLAR CELL STRINGING MACHINE

(75) Inventors: Bernard D. Jones, Amherst, NH (US); Eric de Rivera, W. Boylston, MA (US); Alleppey V. Hariharan, Nashua, NH (US); Steven T. Slavsky, Natick, MA (US); Thomas S. McGee, Concord, NH (US); David W. Lackey, Concord, NH (US); Thomas N. Kirchner, Londonderry, NH (US)

(73) Assignee: G.T. Equipment Technologies, Inc., Merrimack, NH (US)

( * ) Notice: Subject to any disclaimer, the term of this patent is extended or adjusted under 35 U.S.C. 154(b) by 120 days.

(21) Appl. No.: 10/125,329

(22) Filed: Apr. 18, 2002

(65) Prior Publication Data

US 2003/0127124 A1 Jul. 10, 2003

Related U.S. Application Data

(60) Provisional application No. 60/344,993, filed on Jan. 4, 2002.

(51) Int. Cl.[7] .................. B23P 19/00; B23P 21/00; H01P 11/00; H01L 31/18
(52) U.S. Cl. .............. 136/244; 136/256; 136/293; 438/80; 438/64; 438/66; 438/98; 29/729; 29/730; 29/711; 29/714; 29/564; 29/564.1; 29/564.2; 198/346.1
(58) Field of Search .................. 136/244, 256, 136/293; 438/80, 64, 66, 98; 29/729, 730, 711, 714, 564, 564.1, 564.2; 198/346.1

(56) References Cited

U.S. PATENT DOCUMENTS

| | | | |
|---|---|---|---|
| 4,027,246 A | 5/1977 | Caccoma et al. | |
| 4,667,403 A | 5/1987 | Edinger et al. | |
| 4,683,644 A | 8/1987 | Tange et al. | |
| 4,808,242 A | 2/1989 | Murata et al. | |
| 4,854,974 A | 8/1989 | Carlson et al. | |
| 4,892,592 A | 1/1990 | Dickson et al. | |
| 4,929,281 A | 5/1990 | Wörner | |
| 5,266,125 A | 11/1993 | Rand et al. | |
| 5,593,901 A | 1/1997 | Oswald et al. | |
| 5,797,998 A | 8/1998 | Wenham et al. | |
| 5,951,786 A | 9/1999 | Gee et al. | |
| 6,069,313 A | 5/2000 | Kay et al. | |
| 6,248,948 B1 | 6/2001 | Nakagawa et al. | |
| 6,294,725 B1 | 9/2001 | Hirschberg et al. | |
| 6,378,200 B1 | 4/2002 | Lim et al. | |

OTHER PUBLICATIONS

Nowlan et al, "Automated Solar Cell Assembly Teamed Process Research," Final Subcontract Report, Jan 6, 1993–Oct. 31, 1995, National Renewable Energy Laboratory, Golden, CO.*

(List continued on next page.)

*Primary Examiner*—Alan Diamond
(74) *Attorney, Agent, or Firm*—Maine & Asmus

(57) ABSTRACT

A machine for the automated assembly of wafers such as solar cells into strings, comprising a control system, a cell loader with wafer inspection station, a cell tab loader, a string assembly station, and a platen with adjacent pairs of individual cell, opposing edge grippers having multiple sets of vertically operable pincer action fingers for holding cells in string alignment during soldering. The string assembly station has a cooperating cell support and tab tail support mechanism providing for a tab tail hand off from one to the other with a platen indexing movements of cell pitch distance. The platen moves from the string assembly station through a soldering station consisting of a preheat, soldering, and cooling zones spaced a cell pitch distance apart. A string unloader moves completed strings through a string inspection station placing strings in a good or bad string holding area.

32 Claims, 29 Drawing Sheets

OTHER PUBLICATIONS

PCT International Search Report dated Jul. 18, 2002 of International Application No. PCT/US02/12388 filed Apr. 8, 2002.

www.spiresolar.com/Solar/equipment.html—Spire, Cor. website, copyright date 2000.

www.cleanenergy.de/companies/airtherm/prod.html—Air Therm Solartechnik website, (date unknown).

Verlinden, P.J. et al."*Will we have a 20%–efficient (PCT-)Photovotaic System?", Highlihgts of Sandia's Photovotaics Program.* vol. 2 (1998).

Nowlan, M.J. et al. *Automated Solar Cell Assembly Teamed Process Research*, Final Subcontract Report, Jan. 6, 1993–Oct. 31, 1995, National Renewable Energy Laboratory, Golden, CO.

Hagerty, John J., *Equipment Development for Automated Assembly of Solar Modules*, Final Report, Jan. 1982, US Department of Energy, Tracor MBA, San Ramon, CA.

*Equipment Development for Automated Assembly for Solar Modules*, Final Report, Jan. 1982, Tracor MBA, San Ramon, CA.

Bycer, Max, *Automated Solar Module Assembly Line*, Final Report, Aug. 1980, Kulicke and Soffa Industries, Horsham, PA.

Schmela, Michael, *Getting connected Market survey on tabbers, stringers and assemblers,* PHOTON International, The Photovoltaic Magazine, Sep. 2000, p. 32–39.

\* cited by examiner

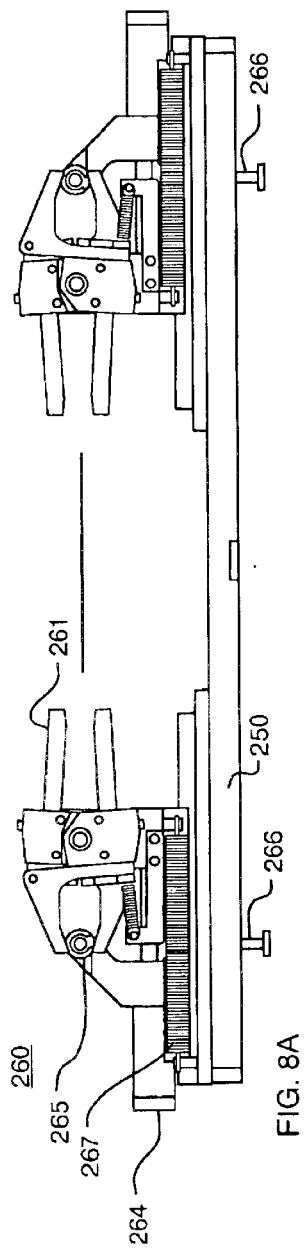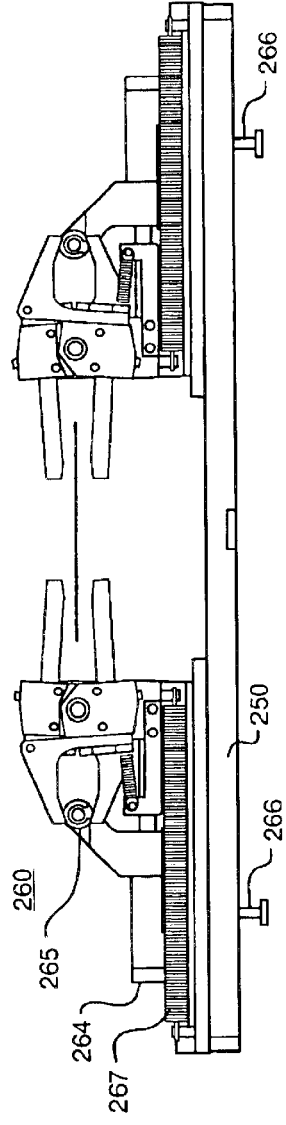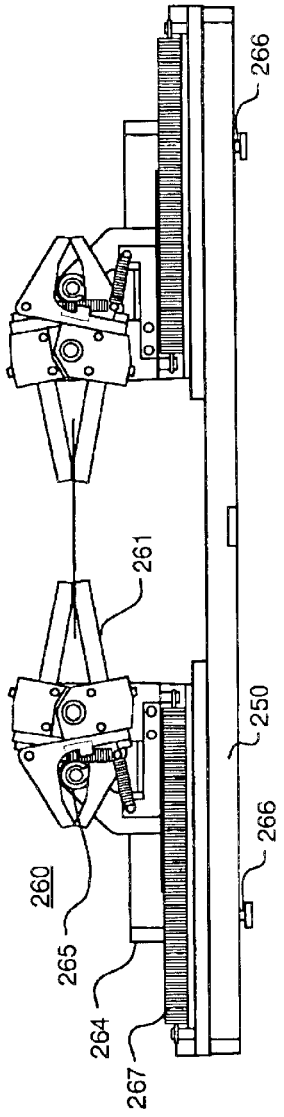
FIG. 8A
FIG. 8B
FIG. 8C

SOLAR CELL STRINGING MACHINE

CROSS REFERENCE TO OTHER APPLICATIONS

This application relates and claims priority to U.S. application Ser. No. 60/344,993 filed Jan. 4, 2002.

FIELD OF INVENTION

This invention relates to machinery for the production of solar panels for converting solar energy into electrical energy, and in particular to the electrical stringing together or connecting of individual solar cells into larger arrays suitable for practical applications and products.

BACKGROUND OF INVENTION

As is well known in the semiconductor art, large area photovoltaic cells that convert solar radiation into useable electrical energy can be fabricated by sandwiching certain semiconductor structures between two electrical contact layers. The front side contact layer is typically a fine line metal collection grid to collect the available current and direct it to one or more contact pads. The back side contact layer generally is composed of a metal such as aluminum. The voltage produced across the contacts of a single cell photovoltaic cell, however, is insufficient for most applications. In order to satisfy the application-related demands for voltage ranges from 12 to 15 volts, it is necessary to connect solar cells in series. The most common arrangement is to provide a linear string of cells in a common assembly, with interconnecting tabbing conductors joining adjacent cells front to back to provide the electrical summing of the individual cell voltages required to reach the desired voltage output level.

In the commercial processes commonly used for module assembly using cells with both front and back contacts, several steps are required. Tabs are soldered on the front contacts of the cells individually, and then the cells are electrically connected by sequentially soldering them into the circuit. Next, being careful not to strain the electrical connections, the fragile electrical circuit cell assembly is transferred to an encapsulation work station. Finally, the cell circuit is encapsulated in the module. This process often requires three or more work stations with low throughput, making the assembly process a very significant factor in the overall production cost.

Attempts have been made to simplify the assembly process, as for example in the Nakagawa, et al. U.S. Pat. No. 6,248,948 disclosure entitled *Solar Cell Module and Method of Producing the Same*. Here, among other features, the cell is produced with both contacts being front side accessible for applying the series connection tabbing. While offering potential for more automated assembly into modules, the disclosure does not extend to the machinery necessary to automate the assembly process.

Hirschberg, et al.'s U.S. Pat. No. 6,294,725 entitled *Wireless Solar Cell Array Electrical Interconnection Scheme*, offers conductive epoxy as a substitute for wire bonding, but again does not extend to the machinery necessary to automate the assembly process.

Semi-automated machinery, such as the SPI-Stringer 1000™ semi-automated production machine and the SPI-Assembler 5000™ is available from Spire Corporation. Other manufacturers including Ascor Inc., Anaconda, Seishin Trading Co. Ltd., Solon AG, SunWare GmbH & Co KG, NPC Inc., and Solarnova are known to service the industry with tabbing, stringing and assembly machines.

SUMMARY OF THE INVENTION

It is an objective of the invention to provide a more automated means of building strings of solar cells for use in photovoltaic panels. A string is a number of solar cells that are physically connected to each other with suitably positioned copper bus-bars, made from tabbing material, that form a series electrical circuit.

It is a further objective to provide a practical wafer stringing machine that can be incorporated into a production process for making electronic and other devices using strings of electrically connected wafers.

It is another objective to provide a machine with a cell assembly station incorporating cooperatively configured tab tail and cell supports where the tab tail support is able to hand off the tab tails from the previous cell to the cell support in advance of placement of the next cell in the string.

It is yet another objective to incorporate a comprehensive soldering process closely coupled to the string assembly station so that the interval between placement of the last cell and soldering of the last cell is minimal, so that total cycle time from string to string is as short as possible.

It is a further objective to provide for pre-assembly cell inspection and post-assembly string inspection to be integrated into the process, with provision for separating out bad cells and bad strings as the process continues.

To this end, there is provided a machine with a unique set of abilities which collectively offer a higher degree of automation than has been previously available. The material input to the machine consists of semi-aligned stacks of wafers that may be solar cells, and reels of pre-tinned tabbing material or other reel-dispensed connector material. The output is strings of electrically connected wafers.

The preferred embodiment machine is designed to work within a particular selected range of dimensions for the wafers or solar cells, but it is an objective of the invention that the design can be scaled to different ranges. For example, the preferred embodiment described below is designed to accommodate 100 to 150 mm (millimeter) wide cells on a 102 mm pitch pattern. The tabbing is applied in dual parallel rows, between 50 and 75 mm apart. Tooling changes and adjustments are required when moving within these ranges. The machine can be adapted or scaled to accommodate variations in size and range.

It is a goal of the invention that the machine can run automatically without operator intervention except to periodically load cells and tabbing material into the inputs and to unload strings from the output trays. Optionally, a requirement for manual inspection of each finished string may be incorporated as necessary step in the continuous operation of the machine.

The machine handles wafers or solar cells without damaging them through physical contact stress or thermal stress. Several pairs of pincer action fingers grip each new cell and tabbing being added to the string on two opposing edges with minimal contact area. The gripping fingers do not sink appreciable heat at the soldering station. The fingers accommodate a degree of waviness in the cell. The electrical connections are made to specification. The string product is geometrically exact within specification. While conventional cells may require front to back tabbing attachments, the machine may be adapted for front to front tabbing if desired.

Other and various related goals and objectives readily apparent to those skilled in the art are satisfied by the invention in its many embodiments, as described, illustrated and claimed herein.

BRIEF DESCRIPTION OF THE FIGURES

FIGS. 8A, 8B and 8C are a progressive end view sequence of a pair of opposing front and back, (here right and left) cell nest fixtures of FIGS. 7 and 8, extending and gripping a cell.

DESCRIPTION OF PREFERRED EMBODIMENT

The invention is susceptible of many embodiments. A preferred embodiment is illustrated in the attached figures and explained below. Minor variations of the preferred embodiment are evident in the figures, but are substantially the same, with common or similar components and the same reference numbers, except as noted.

Figure 1:
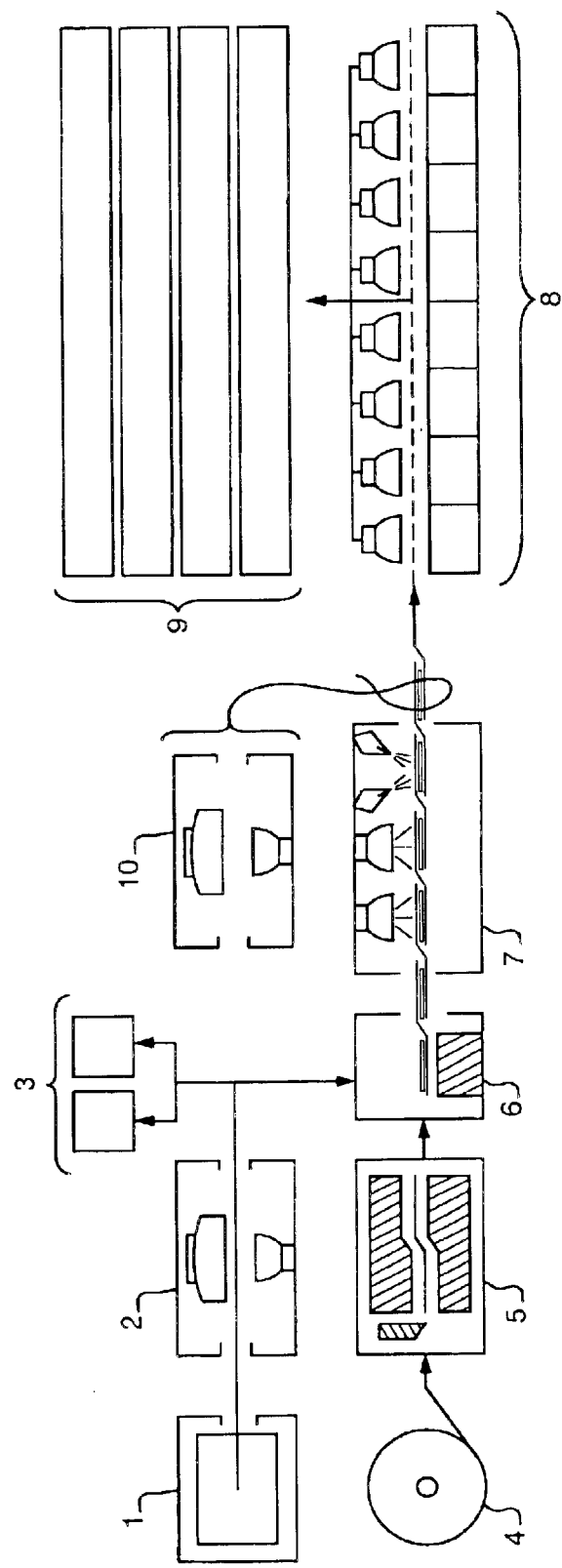
FIG. 1 is a diagrammatic flow chart of the sequence of operation of the preferred embodiments.

Referring to FIG. 1, the basic operation of the stringing machine is readily explained. Solar cells are supplied to the machine at (1), then advanced for pre-assembly inspection at (2), with rejects being disposed of at (3) for either of two reasons. Reels of tabbing material are supplied to the machine at (4), then cut and crimped into tab pairs at (5). Cells and pairs of tabs are transported in sequence to tab and cell assembly area (6) for interlocking alignment on a string platen, then the string is indexed by the platen cell by cell through the three zones of soldering station (7) for preheating, soldering, and cooling. The finished string is advanced out of processing for final inspection (8) and disposition (9) into either good or reject trays. Optionally, an in-process string inspection (10) can be inserted between soldering station (7) and finished string inspection (8).

Figure 2:
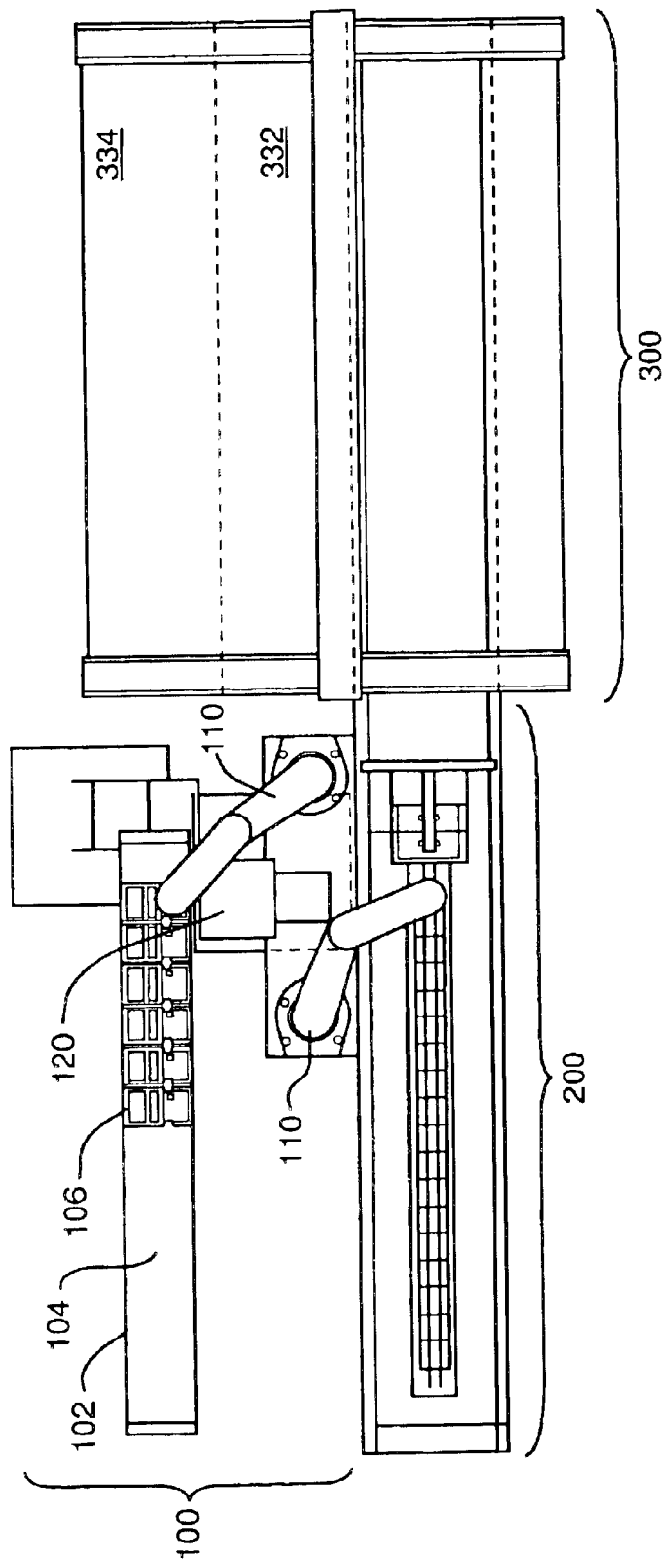
FIG. 2 is a plan view drawing of the general mechanical layout of a preferred embodiment of the invention with two SCARA robots and conveyor configured parallel to the platen and string assembly line.

Referring to FIG. 2, the preferred embodiment machine is broken into three modular components or main sections; the Cell Loader Module 100, the Stringing Module 200, and the String Handling Module 300. In the preferred embodiments, the Cell Loader Module 100 is located behind the left half of Stringing Module 200, and the String Handling Module 300 is suspended above or straddles the right half of Stringing Module 200. The arrangement can be altered somewhat, provided interfacing functionality is maintained. For example, Cell Loader Module 100 may be oriented orthogonally to the FIG. 2 plan, and configured with one or more robots, so long as the SCARA robots are able to reach the cell supply and the Stringing Module 200 cell receiving point.

Both dual and single robot embodiments are illustrated in the figures. The following description and reference numbers apply to both except as noted. A single SCARA robot provides enough wafer handling capability in situations where process demands and timing are less taxing. Two robots provides for faster front end inspection and placement of cells into the cell assembly area. In all embodiments, one cell at a time is added to a string during assembly. The string is transported by individual pairs of cell nest fixtures that are mechanically interlocked to maintain the correct spacing and alignment through the machine. The string handling frame grasps the entire finished string, supporting each cell individually, for inspection and disposition.

First, a general description of some of the individual figures will assist readers to fully appreciate the different functions accomplished within the machine.

Figure 13:
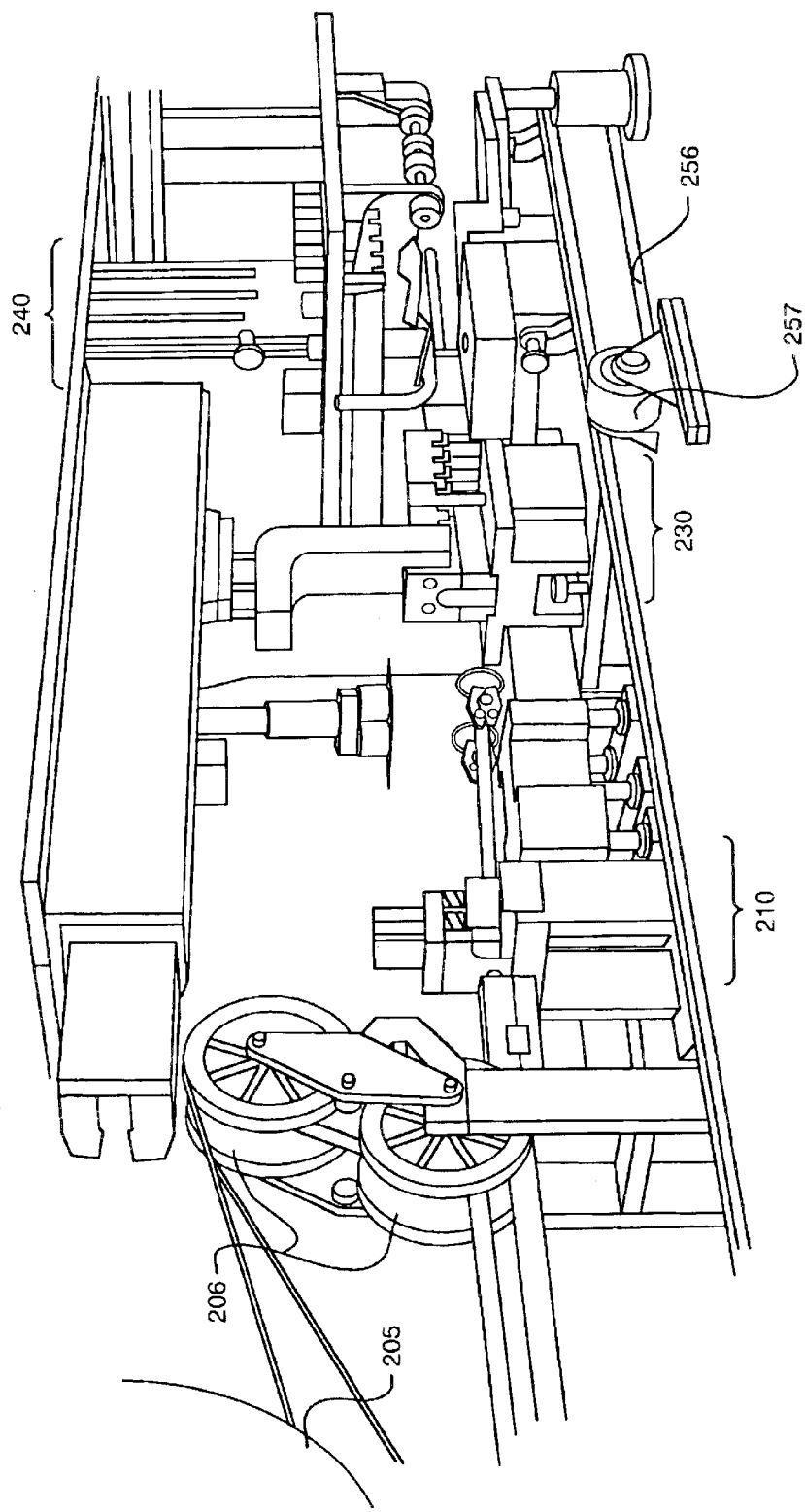
FIG. 13 is a left front perspective view of the string assembly portion of the preferred embodiment, showing the tab payout, tab cut and crimp, cell assembly area, and soldering station, with the platen advanced into the string handling module.

FIG. 13 is a front side partial perspective view of Module 200, showing a portion of one of the tab reels 205 on the left, a pair of spring loaded dual pulley slack take-up reels 206 to the left of center, a tab crimp & cut station 210 to the right of that, soldering station 240 right of center, and the entrance of the string handling module 300 at the far right. The platen drive belt 256 and pulley 257 are also visible at the lower right of center.

Figure 14:
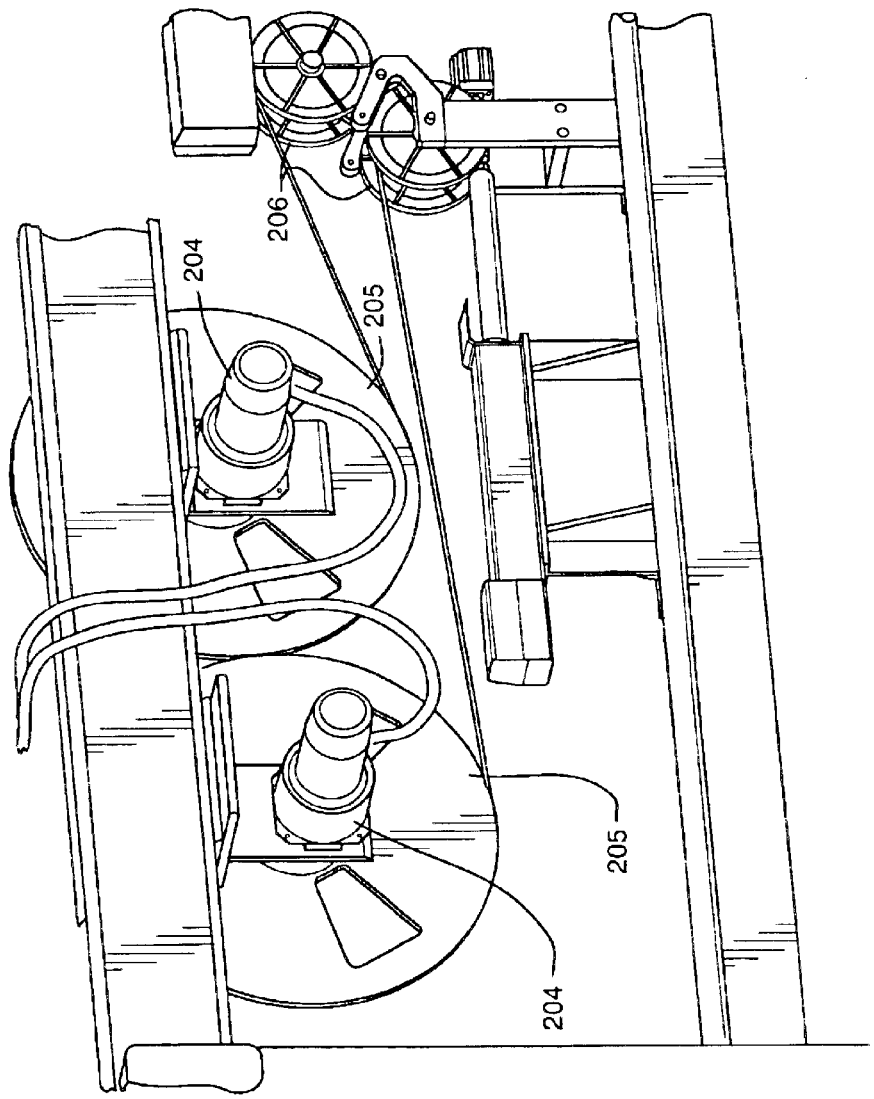
FIG. 14 is a left quarter front view of the tabbing material reels and motors.

FIG. 14 is a front side perspective view of the motorized reel holders 204 and tabbing reels 205 of Module 200, mounted to overhead structure. Not readily apparent in the figure, the reels are offset by the spacing distance of the tabs on the wafers in the downstream sections of the machine, and spaced apart enough so that either reel can be reloaded without interference with the other.

Figure 15:
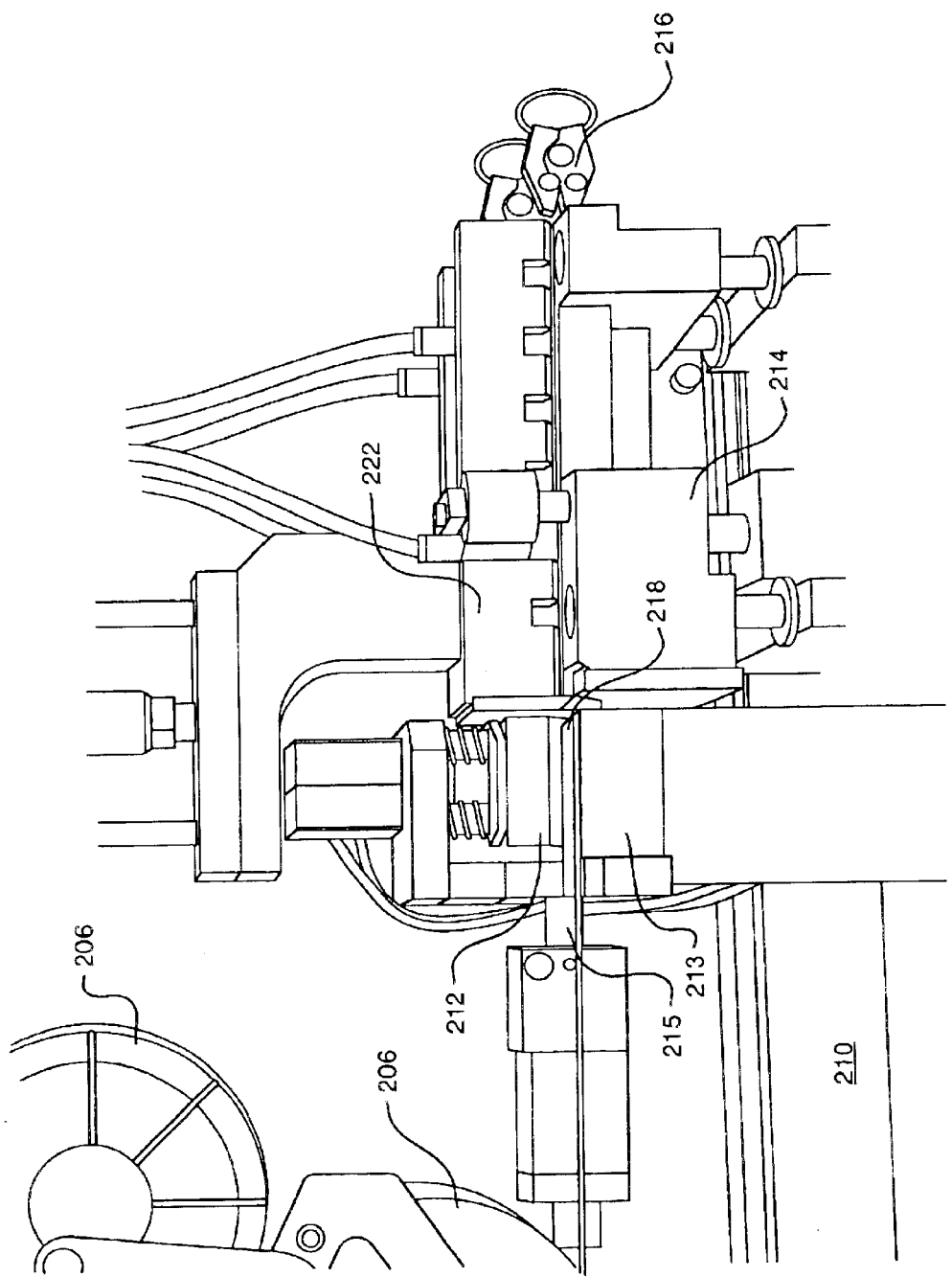
FIG. 15 is a front close up view of the tabbing cut and crimp section, showing the tab transfer tool in the cut and crimp position.

FIG. 15 is a front side perspective close up view of the tab crimp and cut station 210 of Module 200 with the slack take up reels 206 to the left, feeding tab crimper and cutter components at the center; and tab transfer tool 222 in its lowered position on lower crimp die 214. Grippers 216 at the right are retractable after a first set of tabs is cut, crimped and lifted out of the station, back to regrip the cut ends of the tabbing material, then pull the tabbing material forward across the lower crimp die 214 for the next cutting and crimping cycle.

Figure 16:
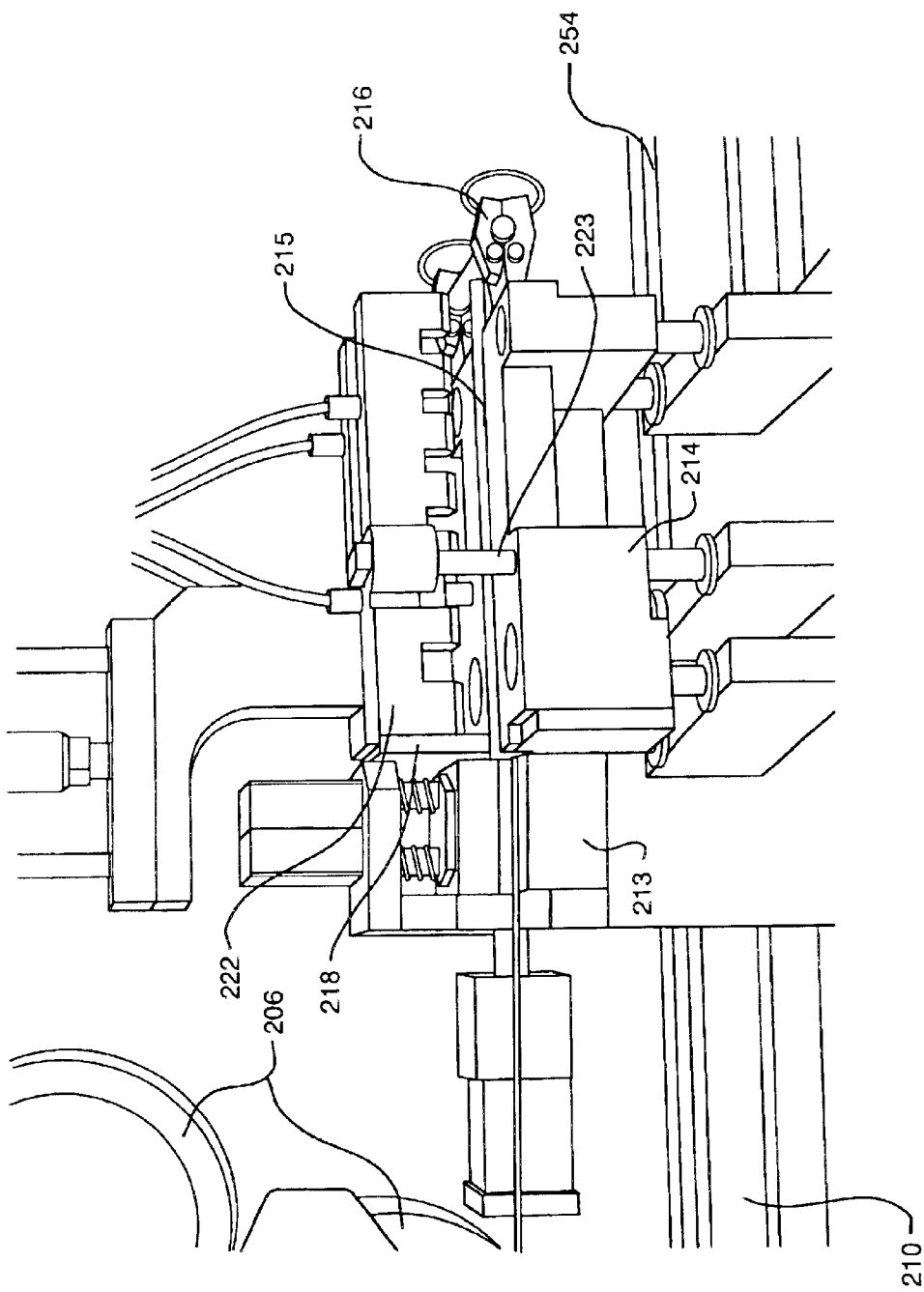
FIG. 16 is the front close up view of FIG. 15 with the tab transfer tool partially disengaged from the crimp die rising towards the full up position for lateral transfer of the pair of tabs to the cell assembly area.
Figure 17:
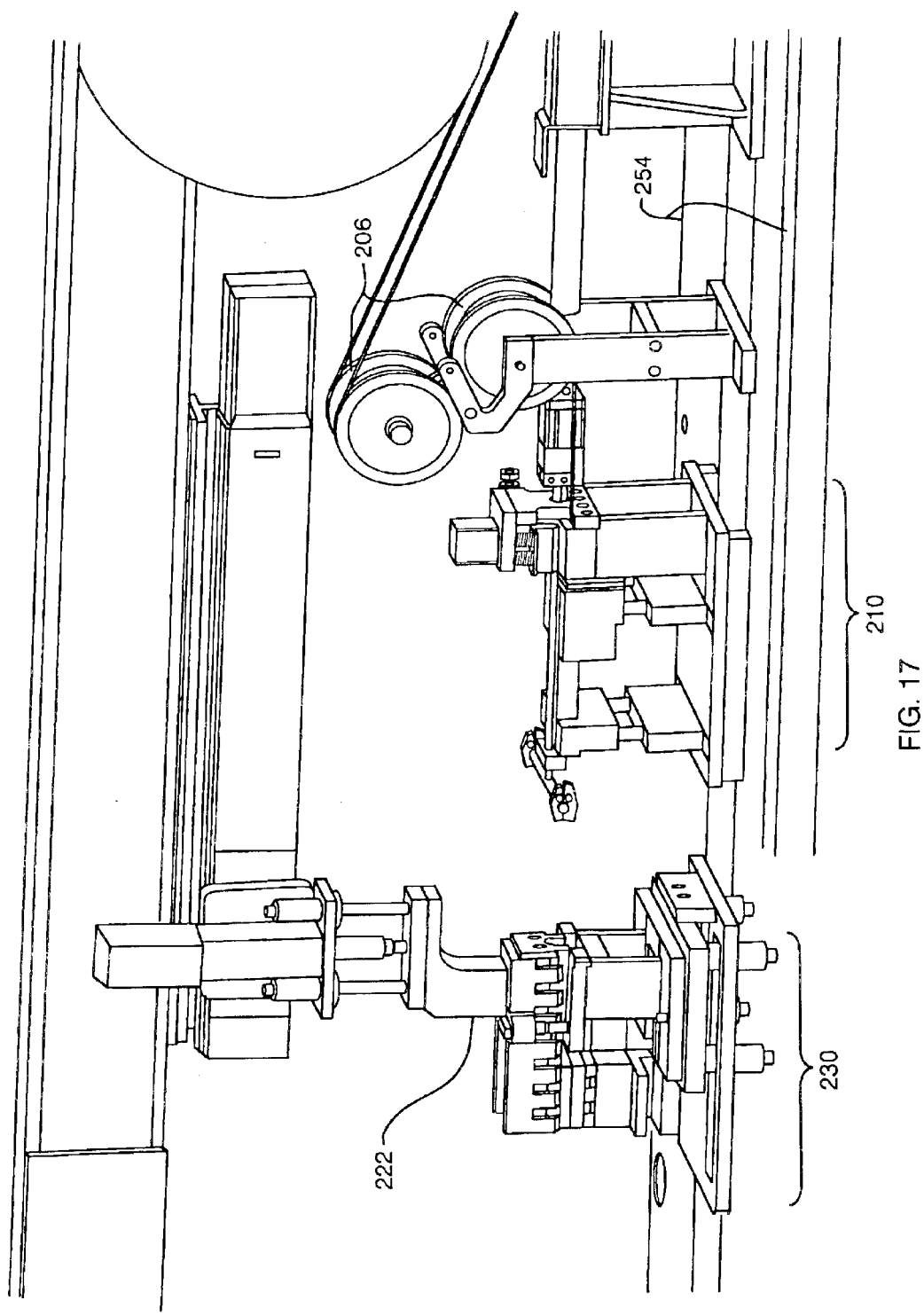
FIG. 17 is a back side right quarter view of the tab cut and crimp station, the tab transfer tool and its lateral movement overhead structure with the tool advanced to the cell assembly area.

FIG. 16 is a front side perspective close up view of the tabber section of Module 200 as in FIG. 17, but with the tab transfer tool 222 being elevated towards its upper position from which it can move to the right, or downstream, carrying the tab pair to the cell assembly area shown in other figures.

FIG. 17 is a back side right quarter view of the tab cut and crimp station 210, the tab transfer tool 222 and the overhead structure providing for its horizontal movement to and from the cell assembly area 230.

Figure 18:
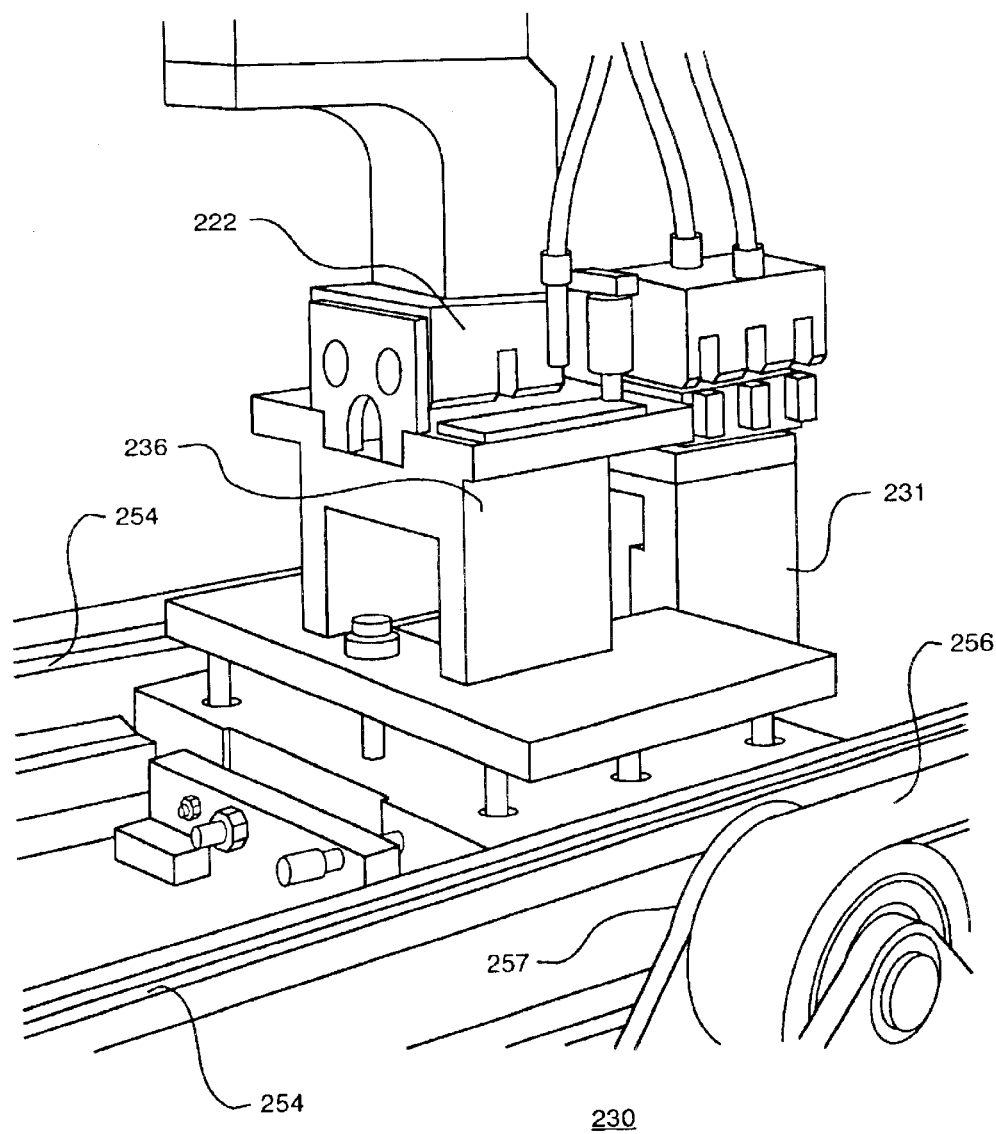
FIG. 18 is a front left quarter perspective view of the cell assembly section with the tab transfer tool in the tab delivery position over the cell and tab tail support structures.

FIG. 18 is a perspective close up of the tab and cell assembly station 230 of Module 200 with tab transfer tool 222 and lower tab holder in the center and a solar cell supported by the cell pick and hold assembly 114 of a SCARA robot. A platen rail and a platen belt pulley are visible below the station.

Figure 19:
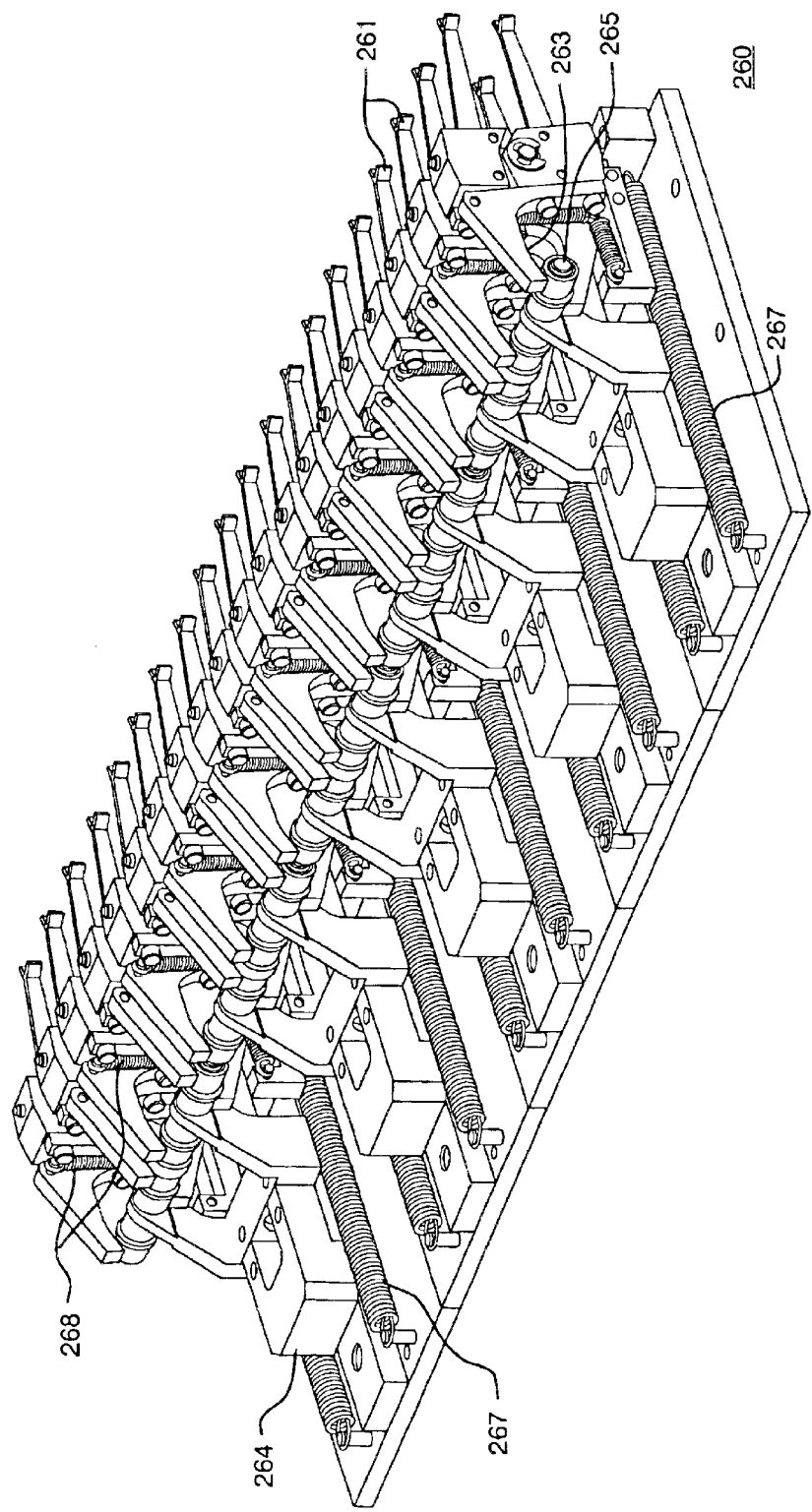
FIG. 19 is a right rear quarter view of the first few cell nest fixtures on one side of the platen, with the fixtures in the retracted, non-gripping position.

FIG. 19 is a right rear quarter view of the first few cell nest fixtures 260 on one side of platen 250, with the fixtures in the retracted, non-gripping position with fingers vertically open.

Figure 20:
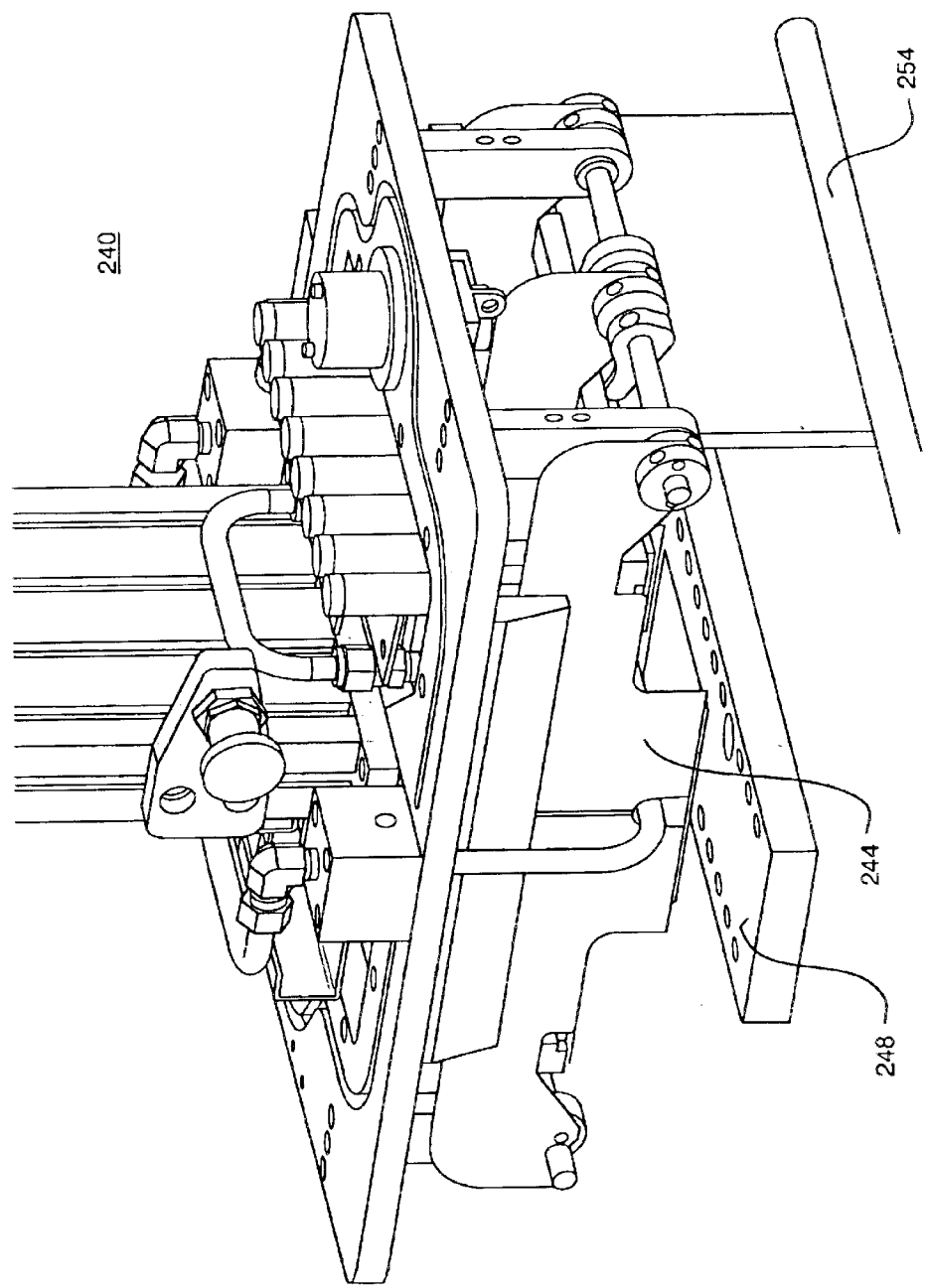
FIG. 20 is a front side left quarter view of the soldering section, with the shield system visible below the lamp connections of the preheat and solder zones.
Figure 21:
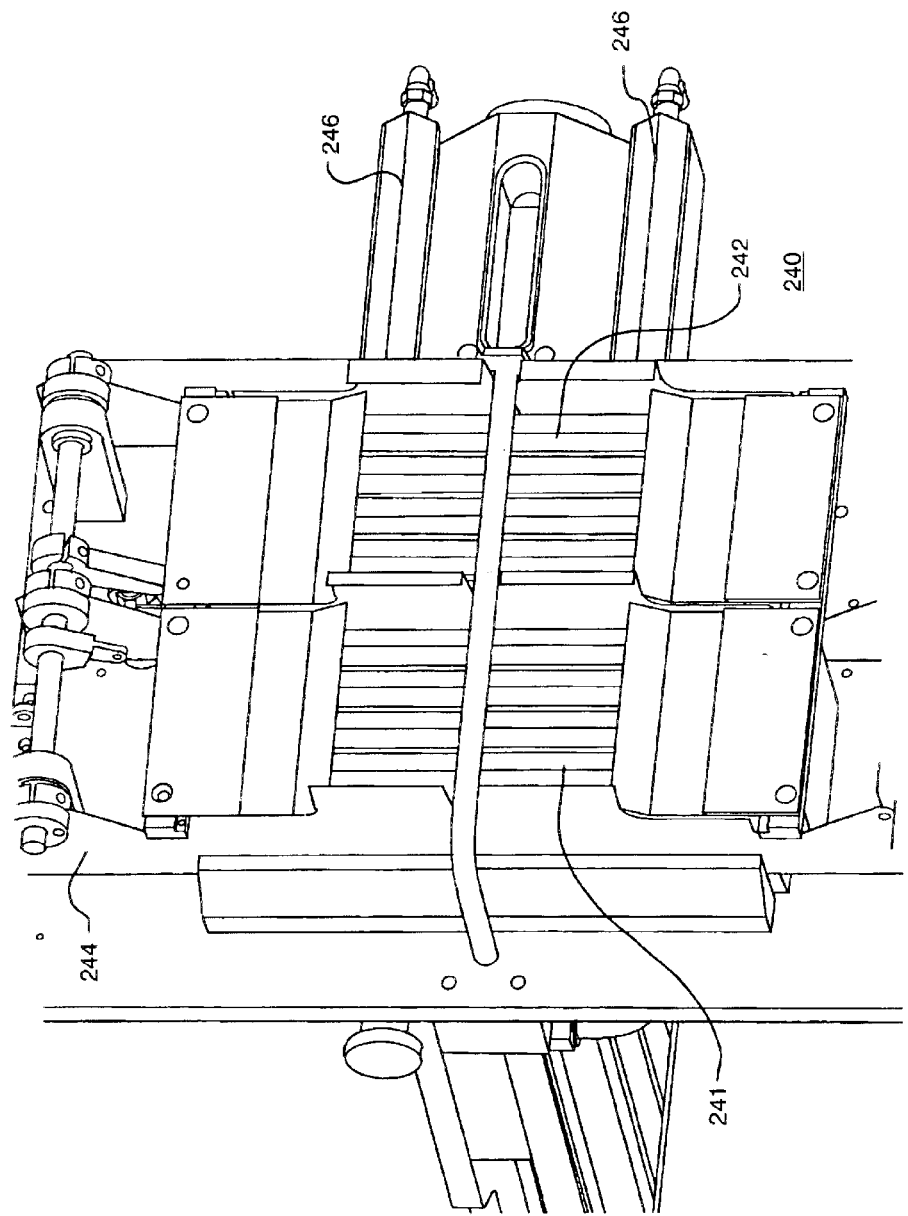
FIG. 21 is a perspective view of the underside of the soldering section, exposing the pre-heat and soldering lamps, and the air jets of the cooling station.

FIGS. 20 and 21 are perspective close up views of the solder station 240 of Module 200, both in position with shield system 244 rotable down over the string line towards exhaust plenum 248 to help isolate the wafers in preheat and soldering positions, and with the tower portion folded back for viewing the face of the unit, with preheat and solder lamp assemblies 241 and 242, and air jets 246 visible for servicing.

Figure 22:
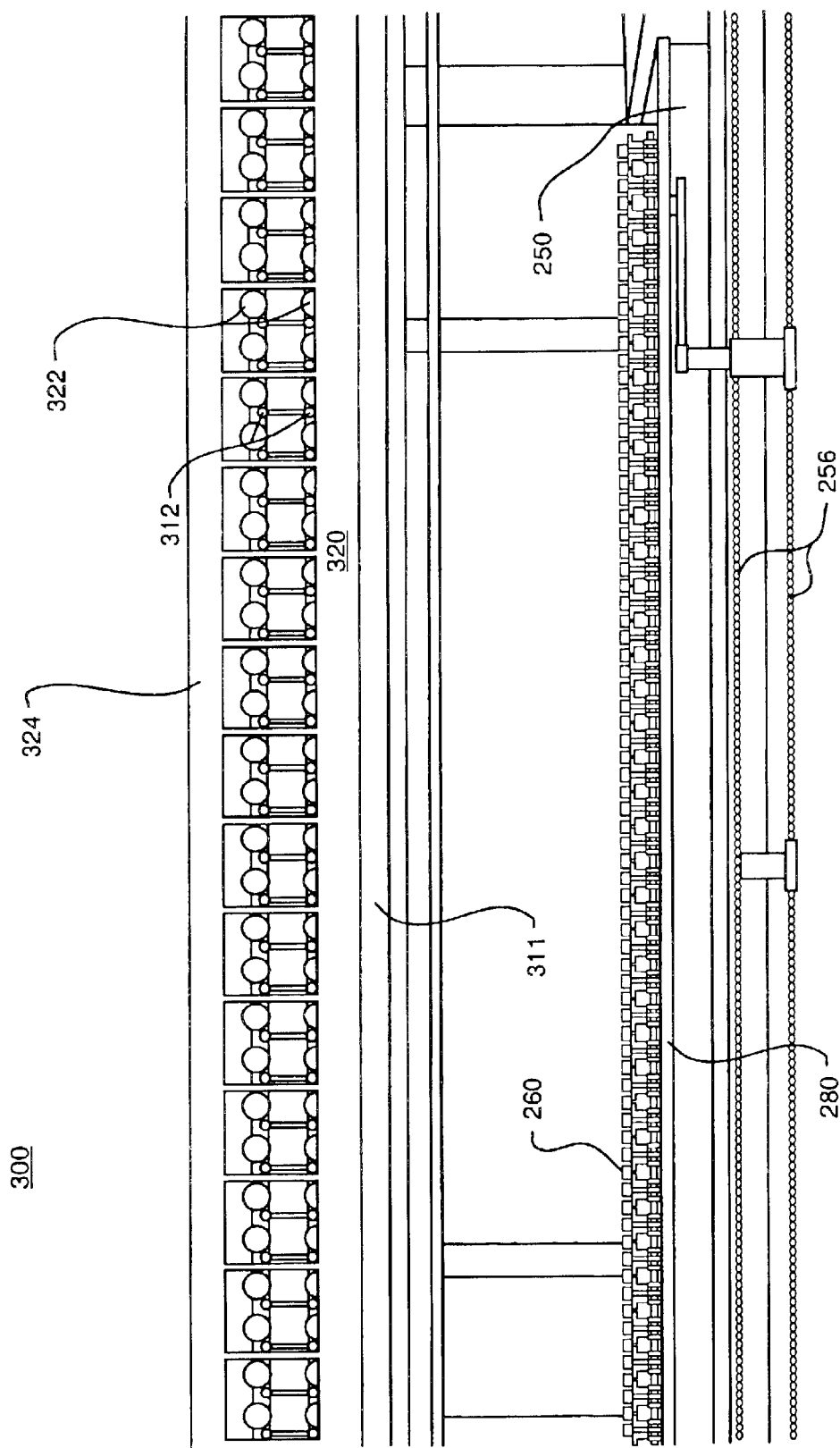
FIG. 22 is a front side view of the string handling section of the preferred embodiment, with the platen and cell nest fixtures fully advanced and with the string handling frame elevated to within the light inspection box.

FIG. 22 is a front view of the string handling module 300 of the preferred embodiment, with platen 250 and cell nest fixtures 260 fully advanced to the downstream end of the machine within reach of deactuator beam 280 for operating the release and retraction of the cell nest fixtures, and with the string handling frame 311 elevated to within light inspection box 320, between lamps 322 and mask 324. Frame 311 is not holding a string in this view, but would be during normal operation.

Figure 23:
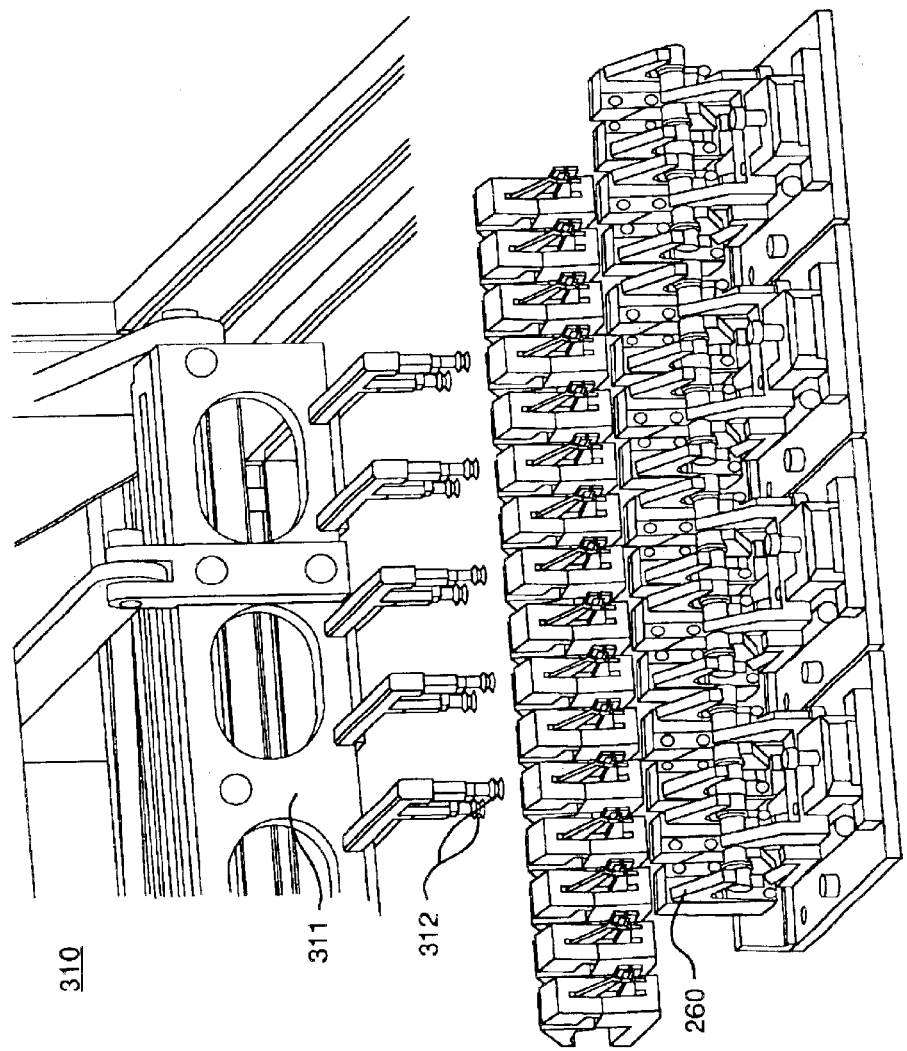
FIG. 23 is a front side close up partial view of the string handling frame suspended over the string line between the front and back side cell nest fixtures as though to pick up a finished string for inspection.

FIG. 23 is a front side close up partial view of the string handling section 310, with frame 311 of FIG. 22 shown with its vacuum cups 312 suspended over the string line between the front and back side cell nest fixtures 260 as though to pick up a finished string for inspection.

Figure 24:
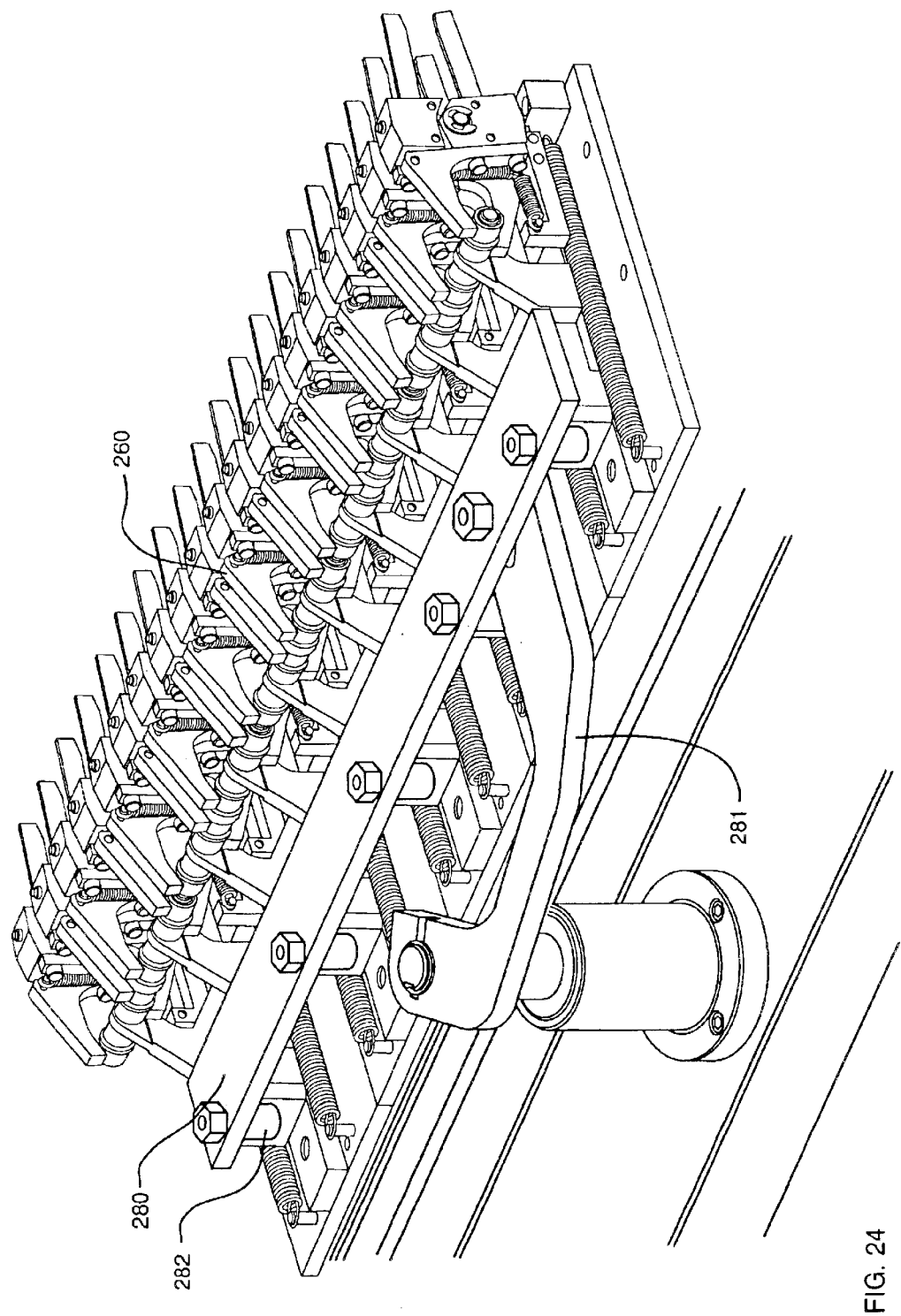
FIG. 24 is a close up view of the deactuator bar contacting the bank of cell nest fixtures to trigger release of the string.

FIG. 24 is a close up view of the deactuator beam 280 advanced by arm 281 to contact cam rolls 282 against the bank of cell nest fixtures 260 to trigger release of the locking pin which will open string fingers to release the string and retract all fixtures 260 from the string line.

Figure 25:
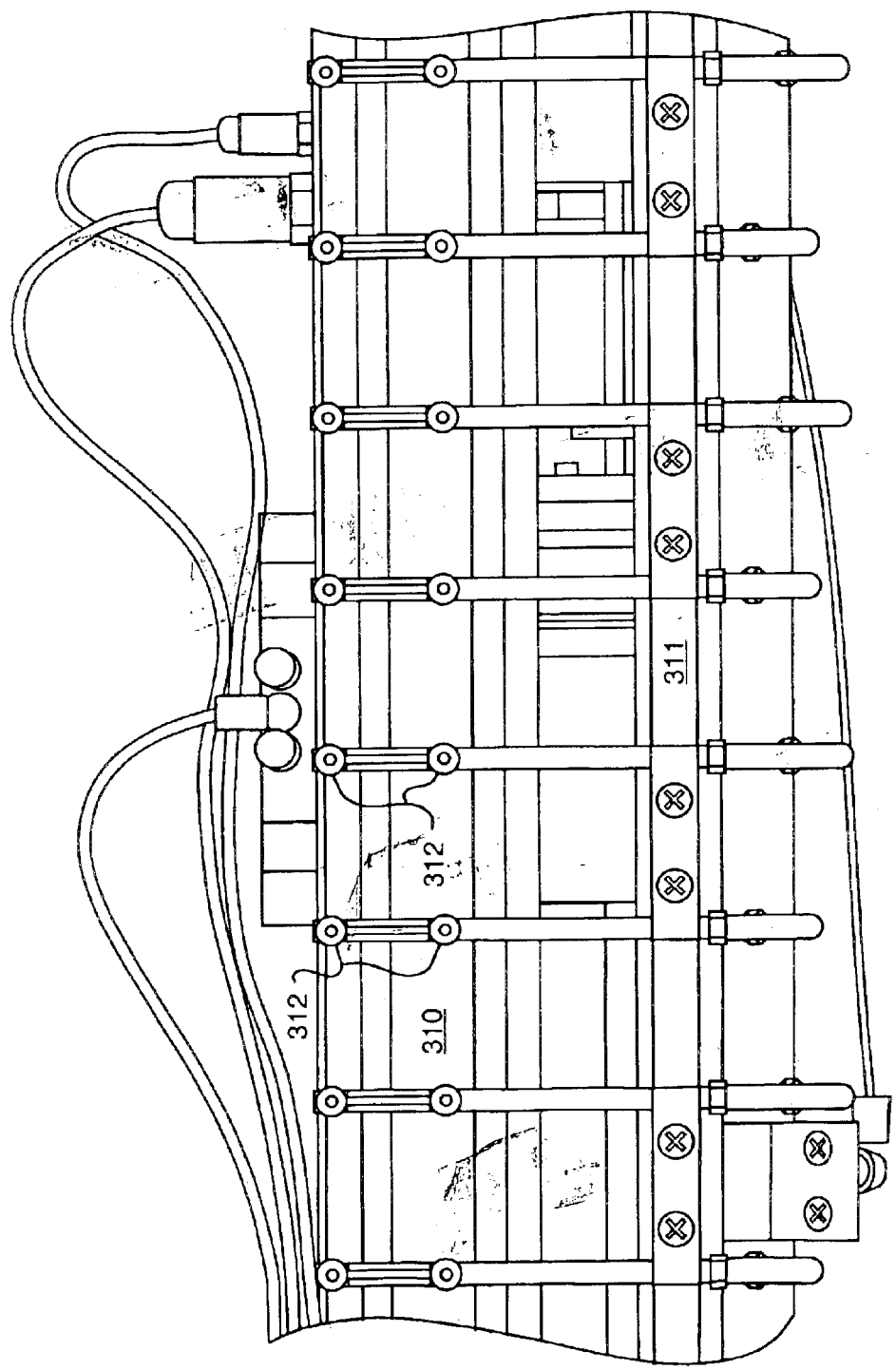
FIG. 25 is a close up view of the string handling frame rotated up 90 degrees from the string line, showing the vacuum cups that normally grip the finished full string for inspection and disposition into a good or reject tray.

FIG. 25 is a close up view of the string handling frame 311 rotated up 90 degrees from the string line, showing vacuum cups 312 that normally grip the finished full string for inspection and disposition into a good or reject tray.

Figure 26:
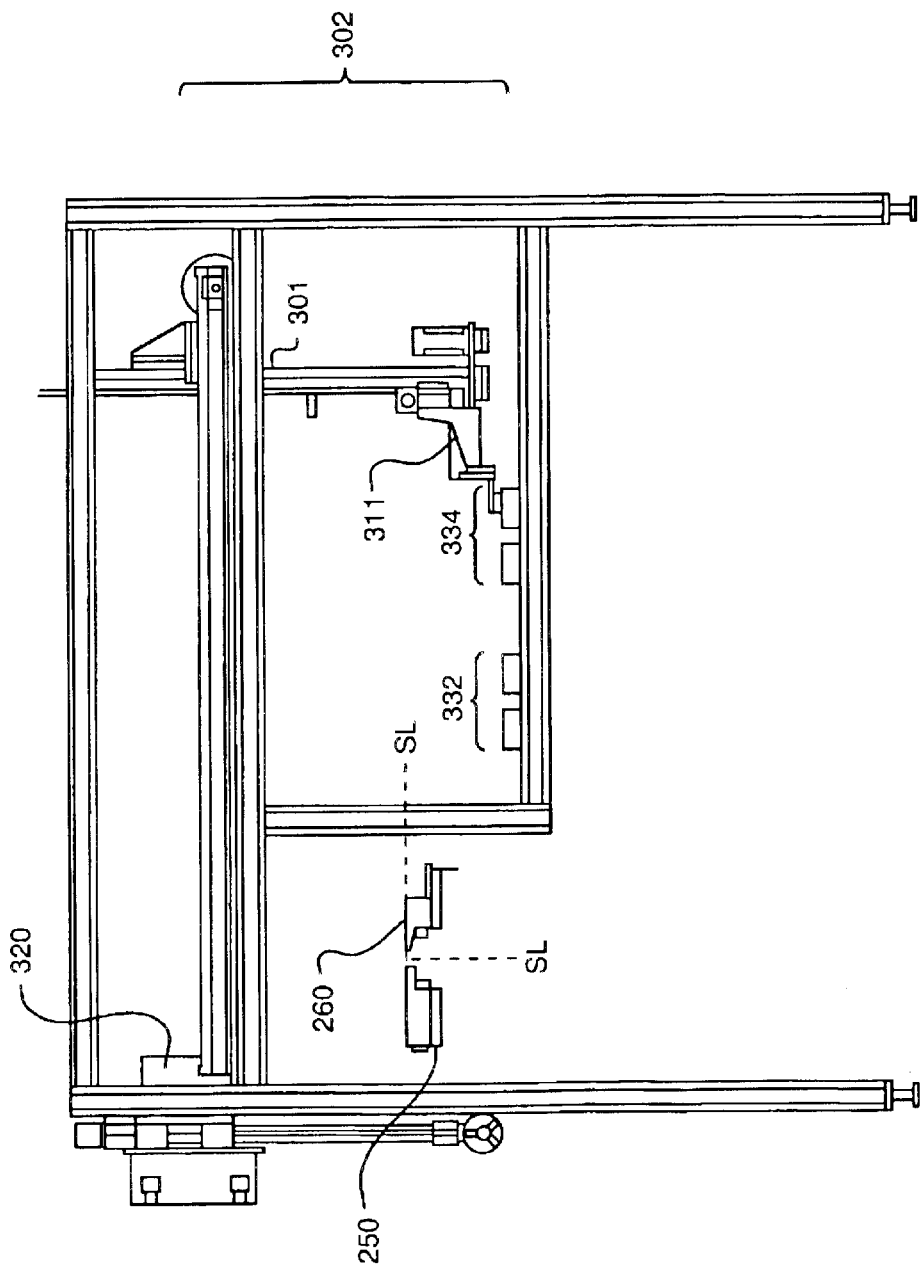
FIG. 26 is an end view of the string handling module showing the relative positions of the string line, inspection box, good tray and reject tray areas, and the string gantry mechanism and string handling frame.

FIG. 26 is an end view of string handling module 300 showing the relative horizontal and vertical positions of the string line SL, inspection box 320, good tray and reject tray areas 332 and 334 respectively, and the string gantry mechanism 302 and string handling frame 311.

Figure 27:
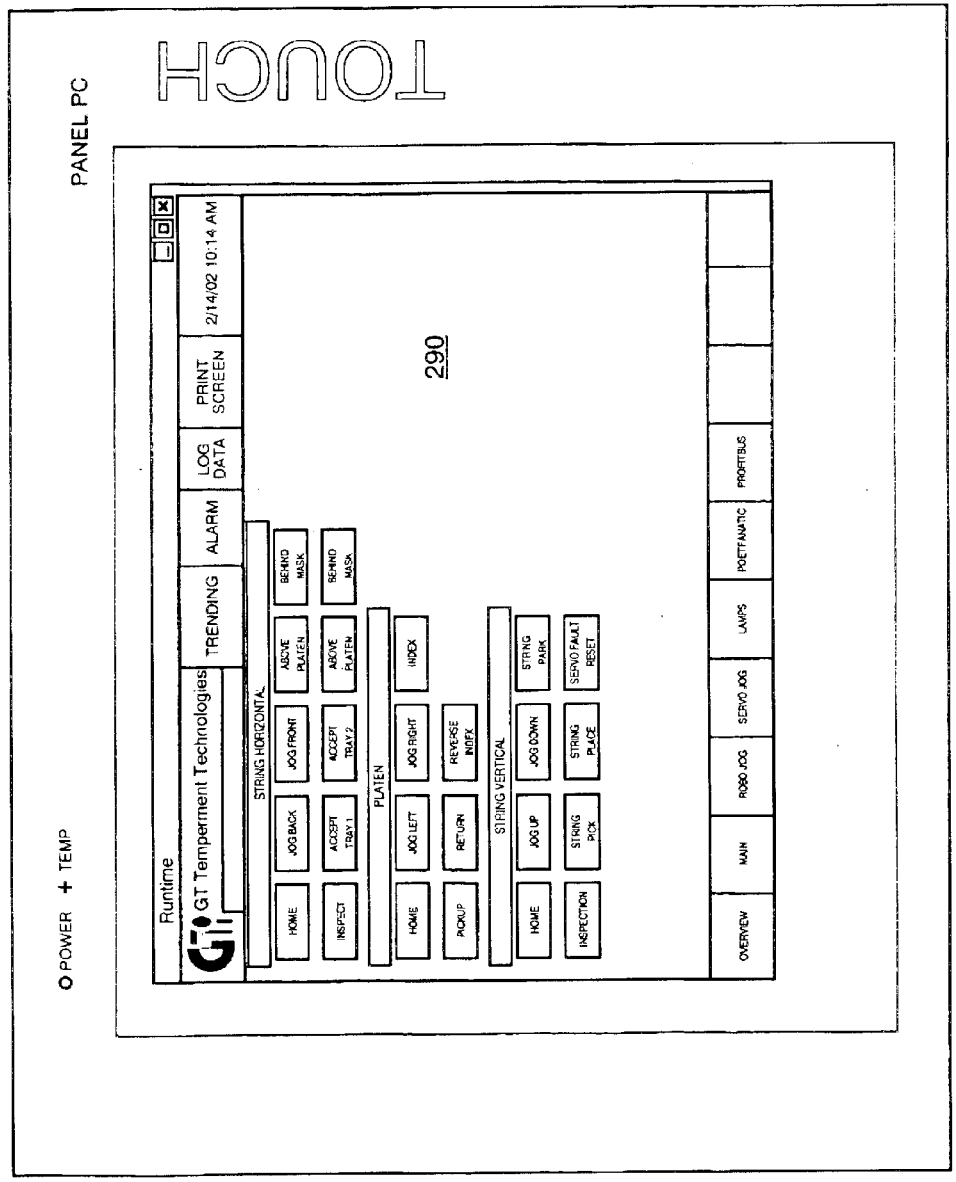
FIG. 27 is a close up frontal view of a control panel on the machine.

FIG. 27 is a close up frontal view of control panel 290.

Figure 11:
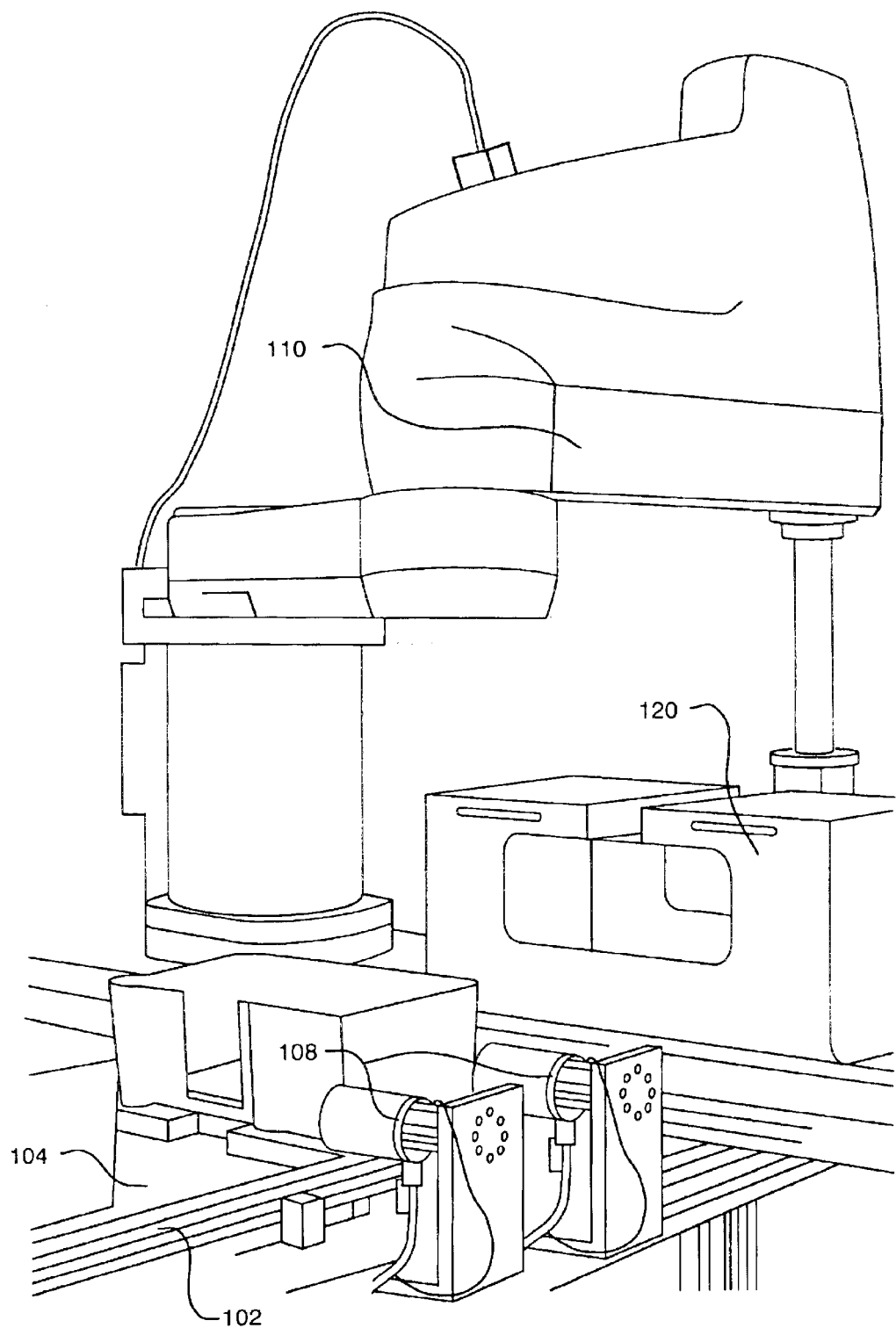
FIG. 11 is a rear right quarter partial perspective view of the cell loading module showing a SCARA robot and cell scanning inspection station.
Figure 12:
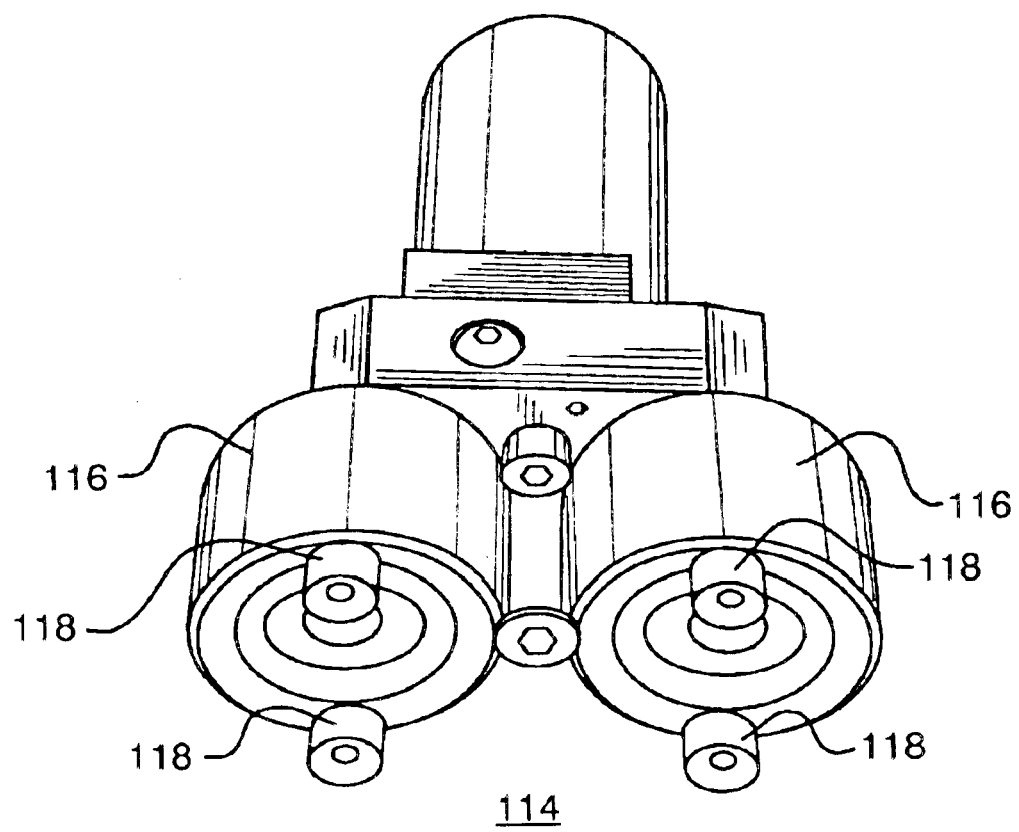
FIG. 12 is a close up partial underside view of the robot tooling consisting of dual Bernoulli chucks and vacuum cups.

Viewing the machine from a modular perspective, referring to FIGS. 2, 11, and 12, the Cell Loader Module 100 loads new solar cells into the Stringing Module 200. Module 100 is a stand alone module that includes an incoming cell stack conveyor 102, which has a polyurethane conveyor belt 104 that holds a total of six cell stack boxes 106. A pneumatic escapement mechanism 108 allows one box 106 at a time into the robot pickup area. 700 mm SCARA (Servo Controlled Articulated Robot Arm) robots 110 configured with cell pick and hold assembly 114 are mounted to supporting structure. Robot controllers (not shown) are mounted on a shelf in the machine frame. The cell pick and hold assembly 114 is a combination of dual Bernoulli chucks 116 and suction cups 118.

A commercial vision package 120 for pre-assembly inspection of cells includes a digital camera with processor and software. Also included are the necessary front-lights, back-lights, light shields, and mounting structure for enabling the vision package. A sliding tray (not shown) supports and locates a pair of plastic cell stack boxes used for accumulating cells that the vision inspection system 120 rejects.

A heavy welded steel frame, with aluminum tooling plate top, supports the robots 110 and the vision system 120, rests on pads on the floor and is bolted to the Stringer Module machine frame. An extruded aluminum frame (not shown) supports the cell stack conveyor 102 and an associated electrical cabinet. Not shown here for simplicity, there is an electrical cabinet mounted underneath the conveyor, housing a PLC (programmable logic controller) along with all the related electrical equipment. Power is brought into this section from the main power cabinet of the Stringing Module 200. Again not shown for simplicity, there is a filter/regulator unit and solenoid valves for operating the escapement mechanism 108, and the pick and hold assembly 114 of this section.

Referring to FIGS. 2–10 and 13–21, the Stringing Module 200 is the heart of the machine. It includes the machine frame welded up of heavy steel structural members. The top surface is made from heavy flat ground aluminum tooling plate bolted to machined pads on the steel frame. A tabbing payoff system consists of a pair of motorized reel holders 204, in which reels 205 of tabbing are mounted, and a pair of spring loaded dual slack take-up pulleys 206. A tab crimp & cut station 210 consists of an air actuated tabbing clamp 212, which closes vertically downward on tabbing clamp base 213, a lower crimp die 214 that is air actuated for vertical movement between an upper operating position and a lower retracted position, a stepper controlled tab puller extendable shaft 215 configured on the distal end with a tab gripper 216, the tab gripper 216 being actuated by a rod within shaft 215, and a tab transfer tool 222 which performs the tab crimping function against die 214, and includes tab cutting blade 218, which is mounted on the end proximate the tabbing clamp 212. Tab transfer tool 222 incorporates vacuum lines and ports configured to grip the cut and crimped tab strips for transport to the next station. The tab transfer function from tab crimp and cut station 210 to cell assembly station 230 is accomplished by tab transfer tool 222, through vertical and horizontal motion capability provided by stepper motor linear actuators.

Figure 3A:
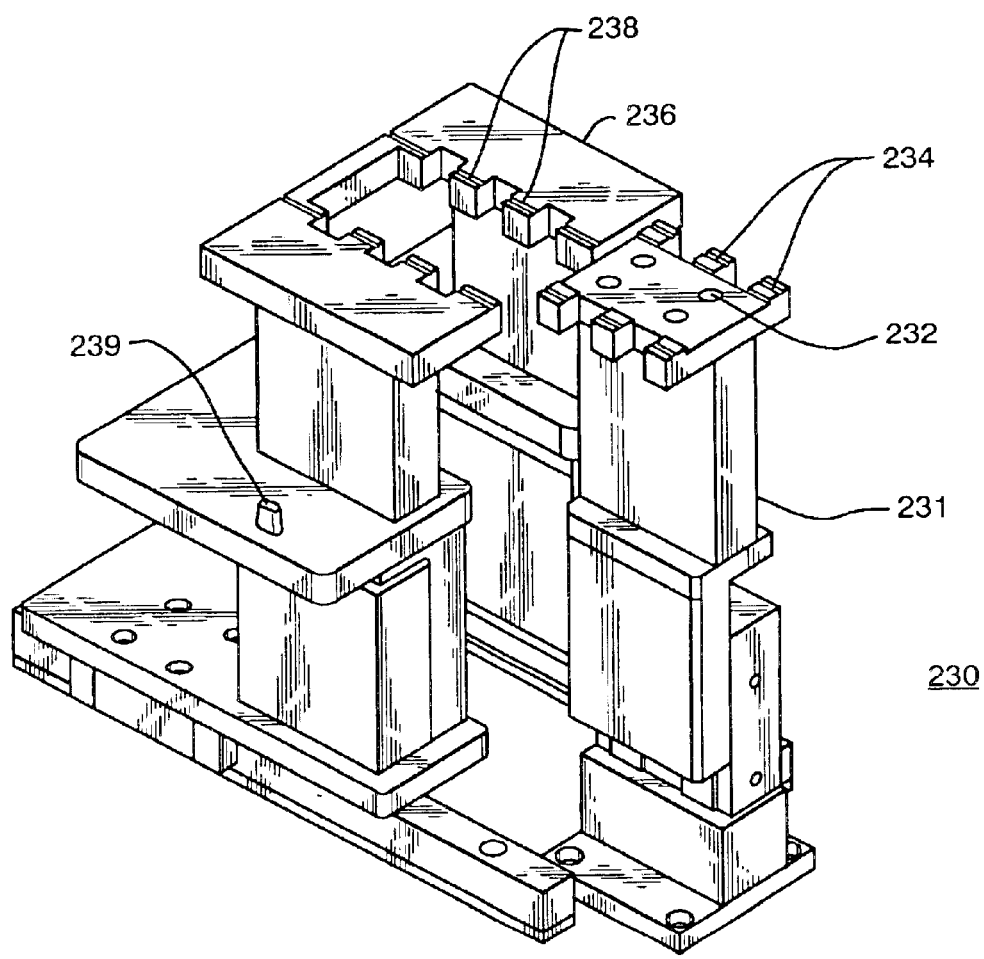
FIG. 3A is a partial perspective view of the tab tail support and cell support structures of the cell assembly station, illustrating the complimentary geometry of the surface areas that permits cyclic repositioning of the two supports for advancing the trailing edge tabs to the cell placement position.
Figure 3B:
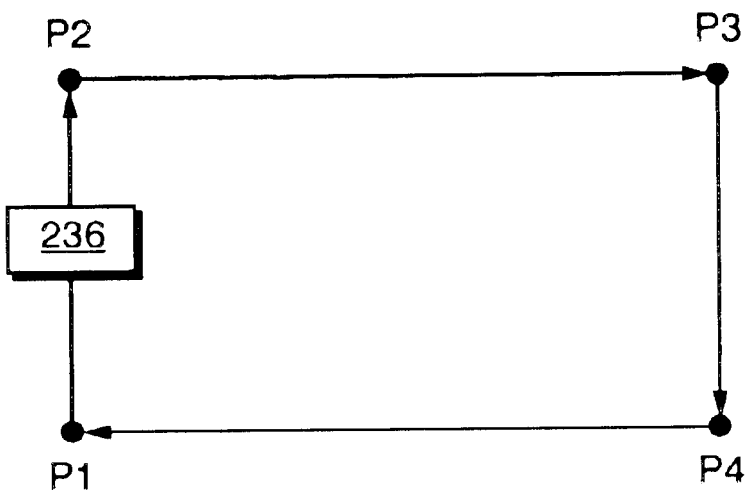
FIGS. 3B and 3C are diagrammatic views of the intersecting paths of motion of the tab tail and cell support structures of FIG. 3A.
Figure 3C:
Figure 4A:
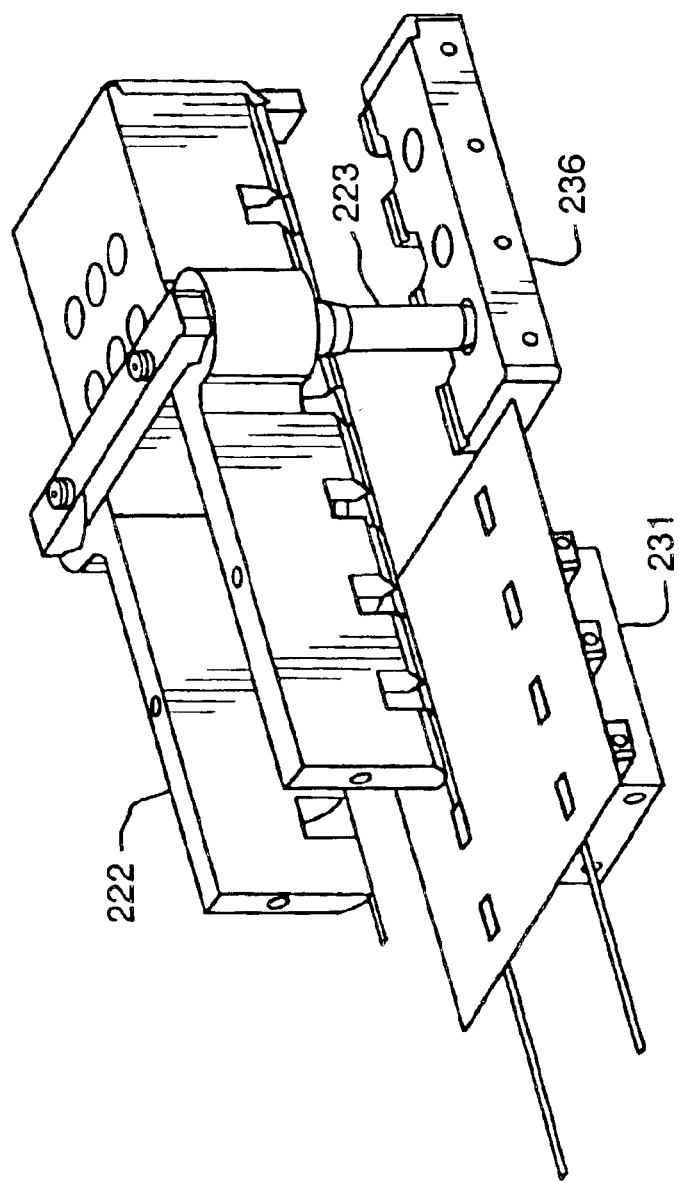
FIGS. 4A and 4B are a rear view partial perspective sequential views of the tab transfer tool vertically descending to deposit a pair of tabs in the cell assembly area with leading ends on the cell support and with trailing ends on the tab tail support structure.
Figure 4B:
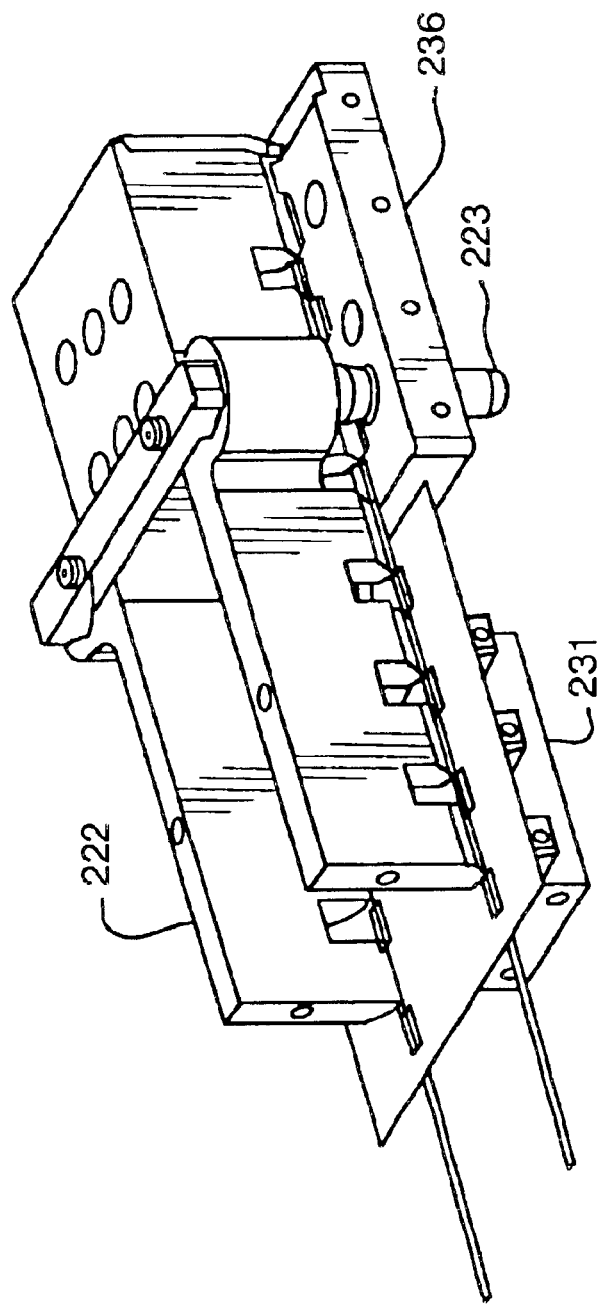
Figure 5:
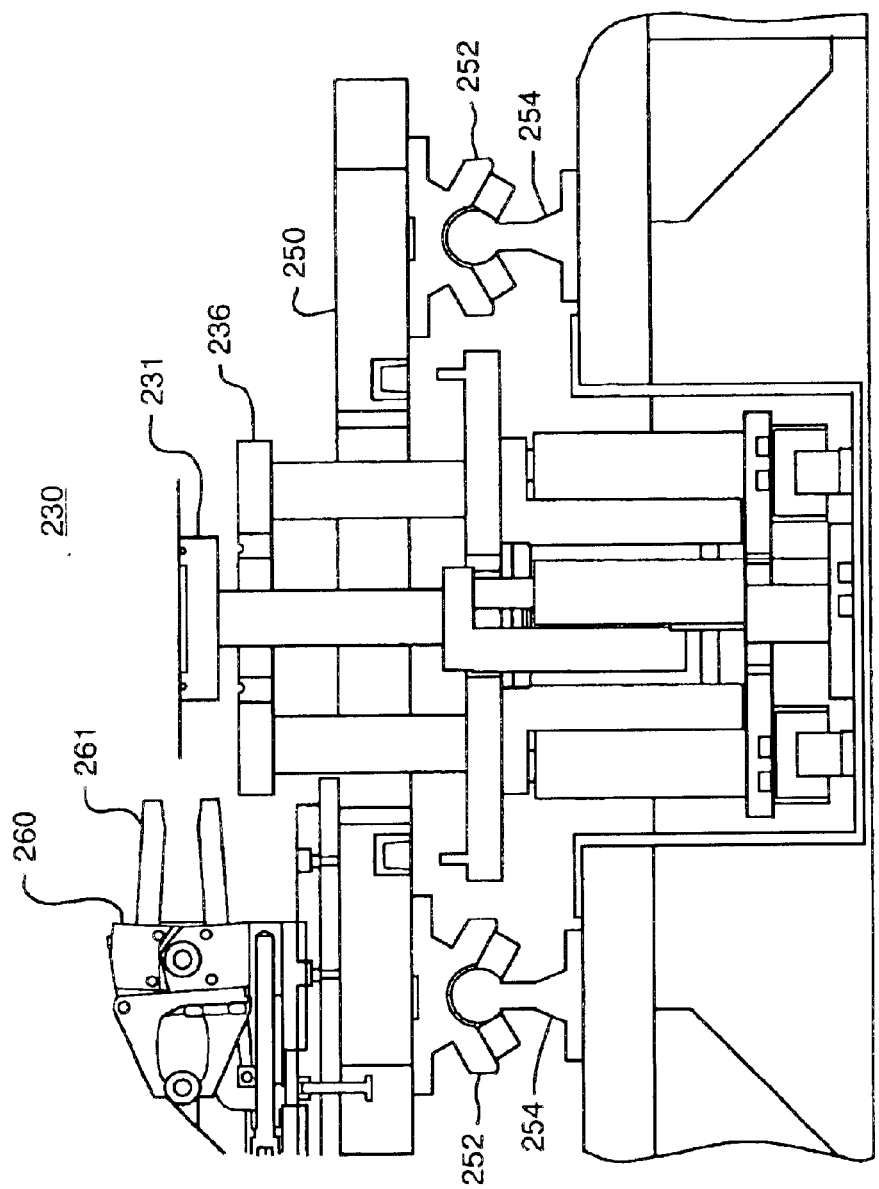
FIG. 5 is an end view cross section at the cell assembly station showing the tab support structure of FIG. 4 with its locking pin disengaged from the platen and its surface level lowered below the level of the cell support structure; platen rails and bearings; and a front side cell nest fixture in retracted position.
Figure 6:
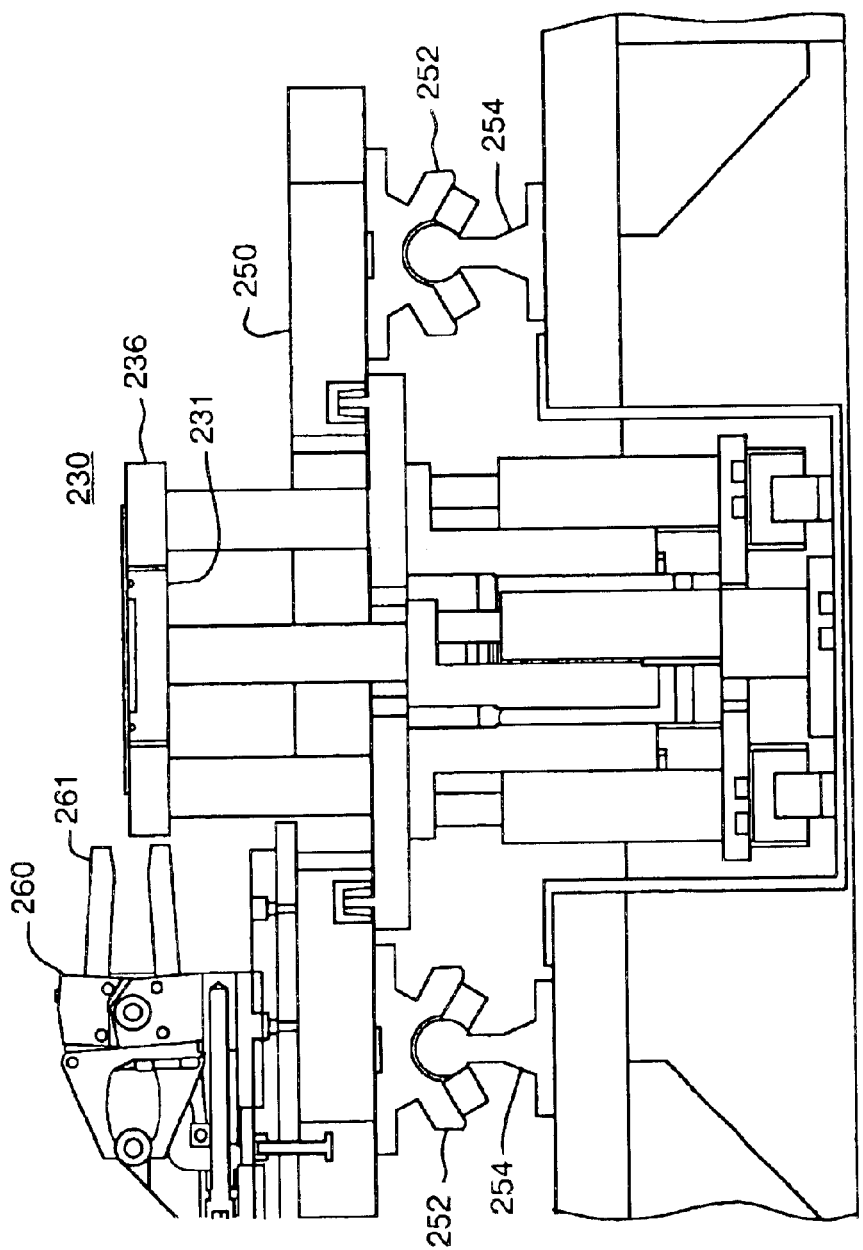
FIG. 6 is the end view cross section of FIG. 5, with the tab tail support structure raised into locking engagement with the platen and its surface level with the cell support structure.
Figure 7:
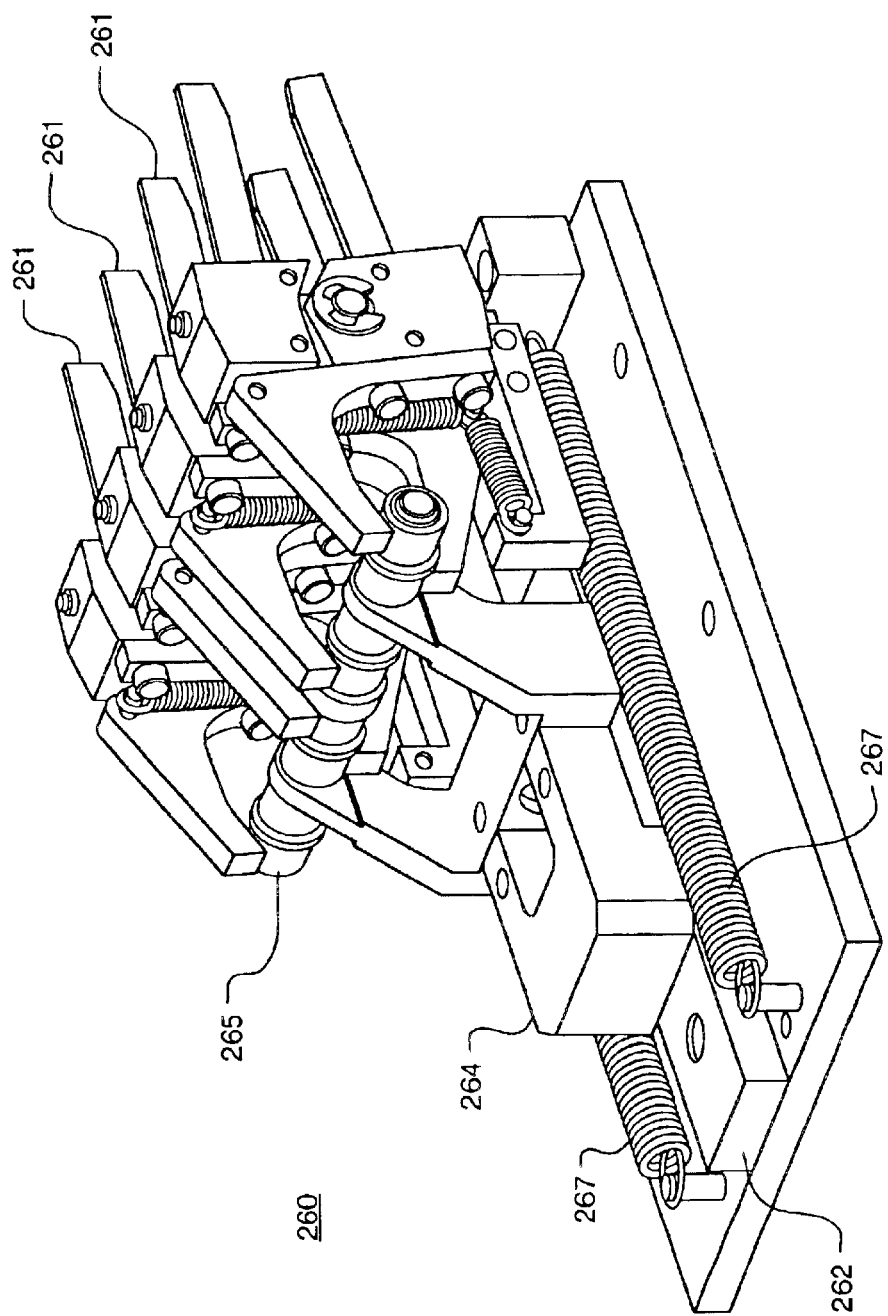
FIG. 7 is a right rear quarter perspective view of the cell nest fixture of FIGS. 5 and 6, in the retracted position with gripping fingers open.
Figure 9:
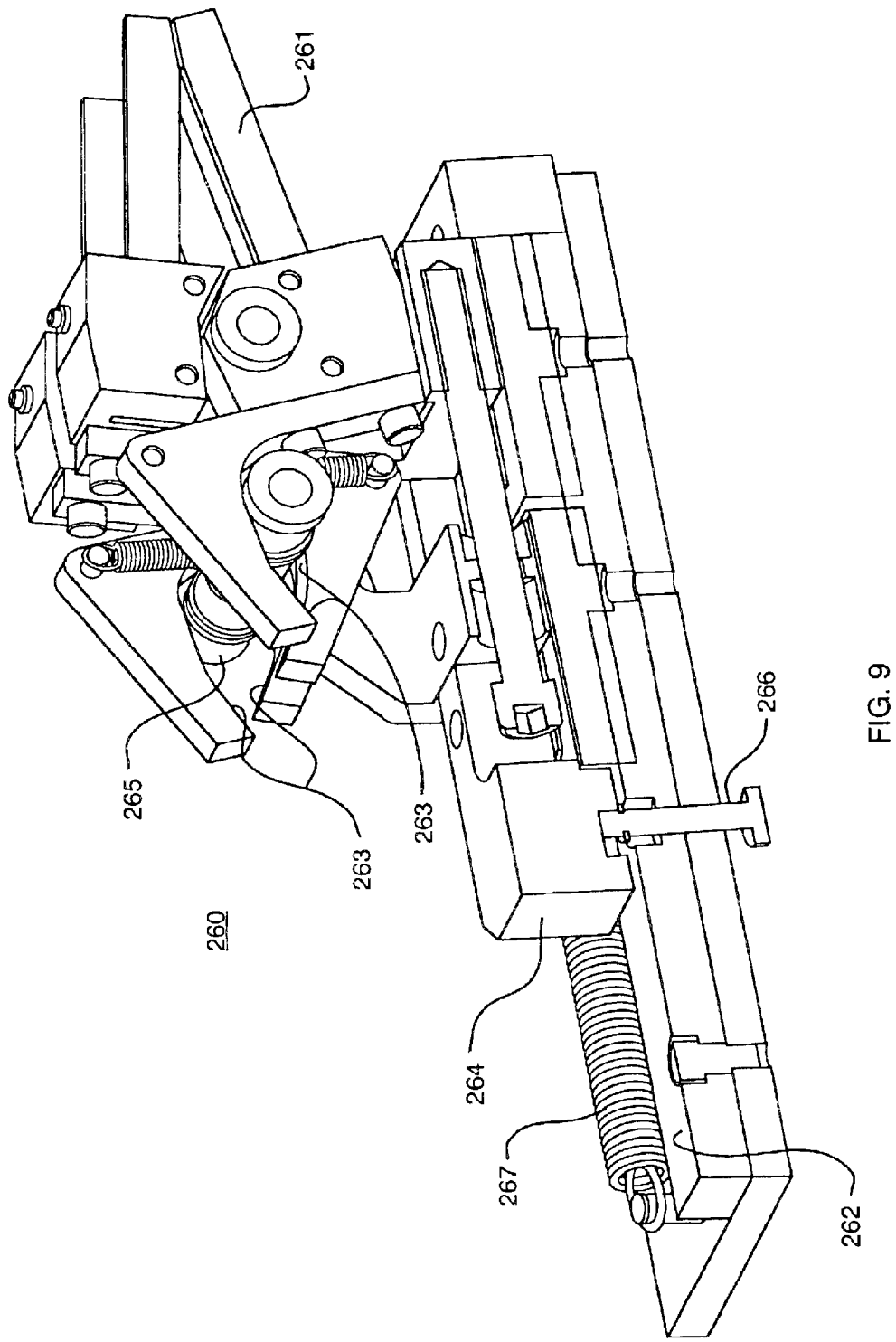
FIG. 9 is a right rear quarter perspective view of the cell nest fixture of FIGS. 7 and 8, shown in the extended position with gripping fingers closed as when holding a cell, the base shown in cross section with the locking pin in position holding the fixture in the extended position.
Figure 10:
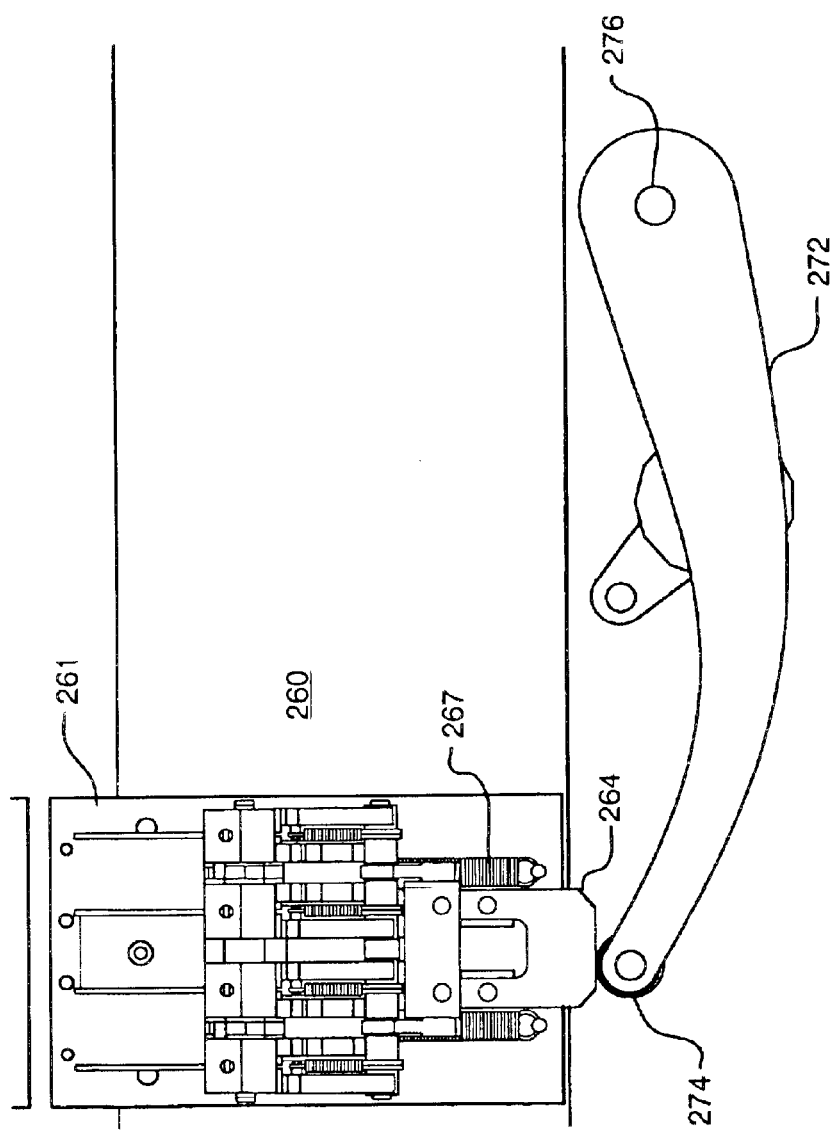
FIG. 10 is a top view of the cell nest fixture and cam actuator of the preferred embodiment, the cam roller tip of the cam actuator bearing on the actuator block of a cell holding fixture.

Referring in particular to FIGS. 3A, 3B and 3C, tab and cell assembly station 230 includes a cell support 231 and a tab tail support 236, the two supports having complimentary interlacing surface areas which together exhibit a common, full surface area, either of which alone is adequate to support a pair of tabs and a cell. Cell support 231 is configured with vacuum cups 232 and vacuum ported tab grooves 234. Tab tail support 236 is configured with vacuum ported tab grooves 238.

As is evident from FIG. 3A, the two side edges of the surface area of cell support 231 are configured as outwardly directed finger supports extending under the tab lines, with spaces between the cell finger supports into which the pincer fingers of the cell nest fixtures 260 (elsewhere described and illustrated) can extend, in order to grip the cell edge together with the underside tail end of the forward extending tabs and the top side leading end of the aft extending tabs. The control system provides that the adjacent cell nest fixtures extend and grip the cell and tabs into string alignment before the cell support is moved downward for platen advancement of the cell into the soldering section.

The tab tail support 236 can be interpreted as divided into left and right side components bridged by a tail piece, each side having tab tail support fingers extending inward under the respective left and right side tab lines. The tab tail support fingers are configured to interlace with the fingers of cell support 231, allowing for vertical movement of the cell support into the same position as the tab tail support and vice versa.

Tab tail support 236 has an air operated two axis linear bearing support, enabling motion between four positions describing a rectangle with a vertical height and a length running along the string line of the machine. Cell support 231 is provided with vertical motion capability between the right side or downstream two of the same four positions. Referring to FIGS. 3B and 3C for clarification, the positions defining the path of tab tail support 236 are designated from a machine front view perspective as lower left position P1, upper left position P2 which is the normal tab tail support position for cell and tab placement, upper right position P3 which is the normal cell support position for cell and tab placement, and lower right position P4. Cell support 231 is vertically movable between P3 and P4.

As explained above, tab tail support 236 and cell support 231 are configured with interlaced surface areas and structural geometries with sufficient clearance to provide for: (a) horizontal forward motion by tab tail support 236 from P2 to P3 when cell support 231 is at P4, (b) horizontal aft motion by tab tail support 236 away from P4 to P1 when cell support 231 is at P3, and (c) vertical movement of either support while both are in the P3–P4 path, and (d) coincident positioning at P3 for the handoff or transfer of the tab tails from support 236 to support 231 in preparation for receiving the next cell.

Specifically, tab tail support 236 can be moved from P2 to P3 when cell support 231 is at P4. Cell support 231 can be raised from P4 to P3 while tab tail support 236 is at P3, where the two supports exhibit a common surface support area. Tab tail support 236 can be lowered from P3 to P4 while cell support 231 is at P3. And tab tail support 236 can be moved from P4 to P1 when cell support 231 is at P3.

Movement of tab tail support 236 from P1 to P2 causes vertically protruding pin 239 on tab tail support 236 to engage a hole corresponding to the position of the platen with respect to which cell of a string is being installed at that point of the cycle. There are 18 holes in the underside of platen 250, corresponding to the 18 cell/string capability of the preferred embodiment machine, the holes being spaced apart at the unit cell pitch length, in this case 102 mm.

Indexing motion of platen 250 in a downstream direction as when a cell is added to a string under assembly, carries tab tail support 236 from P2 to P3. It will be apparent that cell support 231 must be at P4 for indexing to occur.

Downstream in the process flow direction of Module 200, there is a sequential, three zone soldering station 240, which platen 250 with cell nest fixtures 260 traverses. The three zones of station 240 provide preheat, solder, and cooling functions to the process. Station 240 is configured with two water cooled infrared lamp assemblies 241 and 242 for the preheat and soldering zones respectively. The heat penetrates the cell to accomplish soldering of top and bottom side tabs.

The cooling zone is configured with a pair of opposing air jets 246. There is an air actuated reflector shield system 244 that is extendible downward to isolate the zones for process control, and retractable for indexing of platen 250 through station 240. There are upper and lower flux vapor exhaust plenums 247 and 248 connected to an exhaust system. The topside portion of the section is configured with a mounting system that permits the lamp assembly and air jet nozzle to swing up as a single unit, as in FIG. 21, for servicing. Two pyrometers (not shown) are mounted below the string line looking up through holes in the lower flux vapor removal passageway plenum to read the temperature of the cells as they are heated by the lamp assemblies.

A re-circulating water cooler (not shown) has a tank and fan cooled coils that cool and circulate water-glycol mix through the infrared soldering lamps. It is located in the machine frame. There may be additional cooling jets applied from overhead or underneath to the edges of the preheat and/or soldering zones to keep tab crimps relatively cool so as to avoid solder reflow from pooling in the crimp area.

A moving platen system consists of a three piece centerless aluminum platen 250 mounted on six roller type linear bearings 252 that ride on dual linear rails 254 which connect and run the full length of Module 200 and Module 300. Indexing forward motion to platen 250 is provided by a DC servo motor thru a right-angle gear reducer and toothed drive sprocket (not shown) and a steel reinforced polyurethane platen belt 256 with timing teeth. After a finished string is delivered to Module 300, the return motion is made without indexing to commence the next cycle.

Platen cell nest fixtures 260 hold the cells and tabbing in suspension on the "string line" as the assembly of each string progresses through the machine. There are 18 pairs of front and back side cell nest fixtures 260, each pair sized and placed to grip a cell from opposing edges. Each fixture 260 has four pairs of vertically oriented, spring closed, cam opened, pincer-like fingers 261 with ends designed to enable placement of a solder bond between the tab and the cell surface when they are brought to temperature. The fingers 261 are mounted to a linear bearing 262 and are combined with the closing cams 263 in such a way that a single linear inward push to the actuating block 264 and cam roller 265 to overcome the holdback pressure of horizontal spring 267, first slides the fingers into position spanning the edge of the cell, and then permits them to close to a pressure determined by vertical spring 268. A locking pin 266 holds the actuating block 264 in the gripping position until the pin is released by another push of the actuating block.

A cell nest actuator system in Module 200 consists of front and back side arms 272, with cam rolls 274 on the ends, each one pivoting about a bearing mounted shaft 276 mounted in a bearing housing. The cam roll 274 is used to push the cell nest fixture actuating block 264 inward when closing the fingers of a fixture on a cell during cell and tab assembly. A small air cylinder (not shown) is also mounted near the cam roll to actuate the locking pin 266 on the cell nest fixture. Motion is provided with stepper motor linear actuators (not shown) mounted through bell cranks on the lower end of the shaft arrangement.

A cell nest deactuator system in Module 300 consists of a pair of beams 280 with 18 cam rolls 282 mounted along the underside, equally spaced with the actuating blocks 264 of fixtures 260 when the platen is at the end of travel position in Module 300. The beams 280 are mounted on a parallelogram linkage and shaft arrangement (mounted underneath and not shown) so that they remain parallel with the platen while moving in and out together. The cam rolls 282 press against all 36 of the cell nest fixture actuating blocks 264 when the string is to be unloaded, thereby simultaneously releasing all cell nest fixture fingers 261 from the string. The control system described below inhibits release of the string until the string handling system 310 indicates it has a grip on the string. Motion for the deactuator system is provided with a pneumatic rotary actuator through a crank and connecting rod arrangement (not shown).

There is a PLC (Programmable Logic Controller) control system consisting of an electronic controller and input and output module (not shown) for coordinating and controlling all the actions of the full machine. This is all enclosed in an electrical box mounted in the machine frame. Various remote sensors provide feedback of machine status and functions to the controller. Special feedback loop controls are used to provide power to the infrared heating lamps 241 and 242 and the airjets 246 as well as motion controls for the platen indexing servo and the servos in String Handling Module 300. An electrical distribution system has power disconnects, fuses and breakers, transformers, relays, wireways, wiring, etc; all mounted in electrical enclosures within the machine frame.

A fume ventilation system consists of shields, ductwork, and a blower to ventilate the cooling zone of soldering station 240. Upper and lower flux fume ports pull flux fumes during soldering through a pair of air powered vacuum generators and exhaust into the ventilation duct upstream of the blower. A pneumatic and vacuum control system includes a lock-out valve, filter/regulator unit, and pressure switch mounted on the left end of the machine, solenoid valves for air and vacuum as well as vacuum switches mounted on a panel under the frame, and tubing. As illustrated in FIG. 27, there is a main operator interface using a touch screen 290 in a control cabinet mounted on a swing arm in the front middle of the machine.

Safety enhancements include removable panels on the front and sides of the machine frame, hinged transparent shields guarding the tab and cell assembly station 230 area of the machine, a hinged transparent guard guarding the right unload area, fixed transparent shields around the String Handling Module, and a safety gated area guarding the robot work area envelope.

Referring to FIGS. 2 and 22–26, String Handling Module 300 unloads finished strings of cells off the platen/assembly line after it is indexed cell by cell out of Module 200 by platen 250. Module 300 is a straight line extension of Stringing Module 200 and shares the same control system. Module 300 has a gantry frame 301, made from heavy extruded aluminum members. There is a two axis servo driven gantry system 302 consisting of a pair of belt driven horizontal linear actuators for front to back motion, powered through a precision gearbox by a DC servo motor, and mounted on the horizontal slides are a pair of ball screw driven vertical linear actuators driven thru timing belts by another DC servo motor. String handling tool 310 includes string tool frame 311 configured with 72 suction cups 312, four per cell in the 18 cell string. String tool frame 311 rotates downward to the string line and grips a completed string; cell nest fixtures being then deactuated and retracted out of the way. String tool frame 311 then rotates the string 90 degrees upward from horizontal by means of a pneumatic rotary actuator and a bell crank arrangement, to enable horizontally oriented automated or operator inspection and/ or testing of the string.

A string inspection station consists of a light-box 320 with an array of 76 halogen reflector lamps 322 located at the back of the section and directed forward, and a black aluminum mask 324 in front, positioned for masking light around the periphery of the cells of the raised string. Space is provided between the lamps and the mask for raising string tool 310 and the attached string of cells up between lamps 322 and mask 324. The inspection station reveals any through cracks in the wafers to the automated inspection system or system operator. The light-box may be mounted on a linear slide system (not shown) that allows the box to be adjusted vertically to the best height for the test/ inspection procedure.

Module 300 stations for holding trays of good and bad strings are provided behind and below the string line. There is a good string holding area 332 located immediately behind the assembly line extension for holding two trays for placement of good strings, and a reject string holding area 334 behind the good string area 332 for holding two reject trays for bad strings. Sensors detect the presence of trays in the holding areas and also the presence of strings on the trays. Two trays in each area with automated selection to avoid a full or missing tray when depositing finished strings, permits tray changes when required without interrupting the automated machine operation.

A remote operator interface consists of an operator interface panel (not shown) for two-way communication between the operator and the Stringing Module 200 control system, which also controls the String Handling Module 300. This is in a cabinet mounted to the right hand side of the string inspection light box.

Summarizing the operation of the machine, SCARA robots 110 of Cell Loader Module 100 pick cells from input stacks of cells, check them for certain visually detectable defects, and place them one at a time in string alignment on the trailing ends of a pair of crimped tabs in the assembly area of the Stringing Module 200. The leading ends of a next pair of crimped tabs are placed on top of the cell, and the cell is gripped so as to be mechanically interlocked in its proper alignment within the string. After each cell and tab pair placement, the machine indexes the complete set of cell nest fixtures 260 to carry the partially completed string along the string line towards String Handling Module 300.

As the cell string is being indexed from the assembly area 230 on through the soldering section 240 of Stringing Module 200, cells and their top and bottom tabs in the string are being preheated, soldered, and cooled. Further indexing between process operations continues to advance the string into String Handling Module 300. When the string is completed and fully delivered into Module 300, the platen is returned to the starting position, post assembly inspection and disposition of strings into good and reject trays is accomplished, and a new string is initiated at Modules 100 and 200. Pre-assembly and optional mid-assembly inspections of cells, and post assembly inspections of finished strings, are integrated into the apparatus and the assembly process.

Reviewing the machine operation in more detail, and referring generally to all the figures, solar cells are supplied to the Module 100, stacked roughly 100 high in special plastic boxes 106. These boxes are placed on conveyor belt 104. The conveyer belt is used to position the boxes within reach of the transfer arm of robot 110. As the boxes are emptied, a sensor senses the empty box and allows the conveyor to move a full box into the load position. The empty box drops off the conveyor into a receptacle for collection.

Referring in particular to FIG. 12, the head of robot 110 is equipped with a specially designed tool to pick up and handle the individual solar cells. The tool is a pick and hold assembly 114, consisting of dual Bernoulli chucks 116 connected to an air source, with the addition four small flexible suction cups 118 which are connected to a vacuum supply. The cups protrude a short distance below the mouth of the Bernoulli chucks. In operation, assembly 114 is lowered over the cell stack of box 106 to within a few millimeters of the top cell. Airflow is applied to the Bernoulli chuck at the same time vacuum is applied to the adjacent vacuum cups. The outflow of air from the Bernoulli chucks across the surface of the cell creates a low pressure zone above the cell. This causes the cell to lift into the suction range of the four vacuum cups and be secured there for handling by the suction. With the cell secured by the vacuum cups, the air to the Bernoulli chucks can be turned off. The vacuum cups hold the cell in place during the remainder of the cell inspection and placement process.

After picking up the cell, robot 110 brings it into inspection station 120 to detect defects and to register its position on the tool for correct rotational orientation and alignment. At inspection station 120, the cell is stopped momentarily while a special camera takes a digital image of the cell. A backlight illuminates two of the cell edges and the image is analyzed for chip defects in the two edges. The cell is rotated 90 degrees in the horizontal plane and another back lit image is taken followed by a front lit image. This back lit image is used to detect chips on the remaining two edges and also to register the position of one edge and one corner of the cell with respect to fixed reference targets in the background or reference points within the robot's positional database.

The front lit image is enhanced by special lights that flash during the picture taking and by an enclosure that keeps out unwanted stray light. This image is used to check the presence and location of the silver bus lines on the cell surface that are used for connection to the tabbing. Defects in the silver bus lines are detectable in this fashion.

The result of this vision inspection process is to either accept or reject the cell. If accepted, it also provides information to the robot on how to place the cell so that it will be in perfect alignment with the string line or axis of the machine. This alignment will insure that the string is correctly assembled and electrically interconnected. Robot 110 will deposit rejected cells into one or the other of two reject boxes (not shown), depending on whether the rejection is for chips or cracks in the edges, or for defects in the silver bus lines. If either reject box becomes full, a sensor will be tripped and a message to that effect will be displayed to warn the operator to unload or replace the box. This can be done without disturbing the automatic operation of the machine. Once the cell has been inspected and accepted, it is available for placement in the cell and tab assembly station 230 of Stringing Module 200, where it is deposited on the trailing edge of a pair of tabs on cell support 231.

All operation of the Cell Loader Module 100 is controlled by the PLC based (Programmable Logic Controller) control system, which coordinates internal actions including cell stack box movement, robot control, and vision system, as well as managing two way communication with the control system of Modules 200 and 300.

Stringing Module 200 cuts and pre-forms tab pieces from continuous reels 205 of tabbing material, positions these tabs in an interweaving fashion between the solar cells as they are loaded, solders these tabs to precise locations on the surfaces of the cells, and presents the assembled string of cells and tabbing to be unloaded by String Handling Module 300.

The stringing sequence starts with platen 250 being moved to it's leftmost or starting position, "load cell zero", where the first pair of tabs are cut and loaded onto cell support 231 with the leading ends supported by a pair of fingers extending from the front of the platen. After this, the operation of assembling cells and tabs, as further explained below, repeats itself in synchronization with the loading of the cells by Cell Loader Module 100. After each cell and tab set is assembled in place in the string, the platen 250 with cell nest fixtures 260 indexes one cell pitch, in this embodiment, 102 mm, to move the string through the assembly process and make room for receiving the next cell in section 230. In this way, the string is built as it moves towards the right hand or downstream end of the machine.

As it is being built, each cell of the string is gripped in proper alignment for indexed movement with the string through the three zones of soldering station 240; each wafer or cell first passing into the preheat zone infra-red heating lamp assembly 241, then into the soldering zone under the second infra-red heating lamp assembly 242, and on to the cooling zone to be subjected to cooling air jets 246. When the entire string has been assembled and all of the cells have passed completely through the soldering station, platen 250 fast forwards to the string un-load position in String Handling Module 300, where the string is removed from the platen and the platen returned to starting position. The process then repeat's itself.

Optionally, there may be an in-process cell/tab inspection station just downstream of soldering station 240, for automated inspection of each cell and its tabbing connections as the string is assembled. The inspection data may be accumulated and used with post assembly string inspection/test data for the final acceptance/rejection decision, and/or used to terminate a particular string in mid assembly, advancing the faulty, incomplete string to String Handling Module 300 for unloading and initiating a new string assembly cycle.

Returning to the preferred embodiment process, in the soldering sequence, a cell with tabbing held in a cell nest fixture 260, is indexed into the pre-heat zone of soldering station 240, where the first infra-red lamp 241 is controlled to heat the cell to a pre-heat temperature, typically 150 degrees C. The pre-heat pyrometer reads the bottom surface of the cell and inputs this temperature to the temperature control system. The cell is held at the pre-heat temperature until the next index motion, when it is moved to the soldering zone. Here, the second infra-red lamp 242 brings the cell up to the soldering temperature, typically 270 degrees C., causing the solder on the tabbing to flow and create bonds with the cell. Another pyrometer reads the bottom surface of the cell and inputs this temperature to the temperature control system.

The next index brings the cell to the cooling zone of soldering station 240, where air jets 246 blow air on the cell in order to cool it. The warm, waste air is recovered through a suction port between the two air jets 246. In between indexing movements, shield system 244 that separates the three zones is moved down over the string in order to keep the radiation and heat separated as much as possible and supply a uniform temperature distribution throughout the surface of each cell in the soldering station. The shield system 244 is moved up by rotation of a common shaft during the platen index movement in order to provide clearance for the cell nest fingers. Temperature sensors and feedback control at the solder station provides for keeping solder within about 10 degrees of target temperature for containing the reflow within the desired areas.

In the cell and tab assembly sequence, tabbing material is supplied to Module 200 loaded on reels 205. These reels are loaded on the motorized reel holders 204. The tabbing material passes through the set of spring loaded slack take-up reels 206 as it travels to the tab crimp & cut system 210. The position of the take-up reels 206 controls the payoff motors of reel holders 204. The tab crimp & cut system 210 takes tabbing and cuts it to a measured length. At the same time, it puts a crimp in the exact center of the tab. This crimp enables the tab to weave between the top and bottom surface of the two cells that it connects.

Both lower crimp die 214 and tab tail support 236 have registration holes for receiving the locking pins 223 of tab transfer tool 222. The tab transfer tool 222 uses locking pins 223 to come down in proper registration on the lower crimp die 214 in order to cut and crimp a pair of tabs. It then picks up the pair of tabs and transfers them to the tab and cell assembly station 230. Except for the very first tab of a string, the leading end of this tab pair is positioned on a cell that has just been loaded by the cell loader robot 110 onto cell support 231 and is being held by four vacuum cups 232. Vacuum ported tab grooves 234 are holding the tails of the previously loaded tab set in place.

The cell nest actuator side arm 272 pushes the actuator block 264 on cell nest fixture 260 inward, bringing the fingers 261 in and around the edge of the cell and then closing them on the cell and tabbing, clamping the tabbing to the cell. An air cylinder under the cell nest actuator inserts the latch pin 266 to lock the actuator block in the forward or finger gripping position, and actuator side arm 272 moves back out of the way.

Once cell nest actuator side arm 272 is out of the way, platen 250 indexes a distance of one cell pitch, in this case 102 mm. The entire process above repeats itself String Handling Module 300 receives finished strings gripped by cell nest fixtures 260. String tool 310 is positioned closely over the string and vacuum applied to string tool suction cups 312. After the string tool suction cups 312 take hold of the cells, the cell nest de-actuator beam 280 and cam rolls 282 releases and retracts all cell nest fingers 261. String tool 310 rotates the string up 90 degrees from platen 250 and brings the string into string inspection light box 320 for visual crack inspection by the operator, or optionally, by an automated stationary or scanning computer based vision system. After inspection, the operator inputs either "good" or "reject" into the remote operator interface, or the automatic inspection system does the equivalent, which prompts the string to be moved and deposited in one or the other of a "good string" tray in good string area 332 and a "bad string" tray in reject string area 334.

The inspection station light box 320 is adjustable in height to accommodate the operator or other inspection criteria. The upward limit of string tool 310 is likewise adjustable.

The good string area 332 and the reject string area 334 are each configured with sensors to hold two trays for rotating use, so that trays may be removed and replaced without interrupting string assembly. If in either string area there is no available tray space to receive a respective string when ready for release from string tool 310, the control system will stop the machine.

Optionally, there may be an in-process visible defect cell inspection station similar to station 120, or other type of in-process automated cell by cell inspection of the string in process, situated between Module 200 and 300, through which the string is transported enroute to Module 300. This optional station may provide automated further inspection for visibly detectable flaws introduced in the assembly process, or other forms of test or inspection. The level of variation of inspection or test result required to trigger a response may be pre-calculated and determined through a computerized pattern recognition algorithm. The machine response to a detected fault or defect can be variously set as to mark or note the string for later re-inspection or alternate use; trigger an expanded post assembly inspection of this particular cell and string as part of the automated process; or to abort the assembly of this string, clear the machine, and initiate assembly of the next string.

Additionally, the finished string inspection station 310 of Module 300 may be adapted to include electrical string testing, such as electrical circuit continuity and/or electrical response versus illumination intensity. Other parameters such as temperature may be factored into the post-assembly test/inspection process.

Practitioners skilled in the art will readily appreciate the required details of the control system for coordinating the functions described to achieve the correct result. Various automated interrupt options can be incorporated to address possible machine malfunctions and materials defects, so that manual intervention can be used to correct and restart the operation. Some problems can be programmed for automatic handling, such as expelling a partially completed string and depositing it in the reject tray if, for example, a cell were not properly placed or became displaced at the cell support position prior to the application of the next tab set, or an anomaly was detected by sensors in the soldering section or in the post soldering inspection station prior to completion of the string.

The invention is susceptible of many embodiments and is applicable to more than just solar cells. For example, the invention may be configured to handle any similar size electronic wafers required to be interconnected by similarly applied conductors or flexible cable material that can be feed off reels, into a string of electrically connected wafers The front end inspection of individual wafers and the post solder section inspection of wafers, as well as the completed string inspection, can be expanded to include wafer specific or sub circuit specific electronic testing As another example, there is within the scope of the invention a machine for the automated assembly of solar cells into strings, consisting of a computerized control system, an operator interface, a cell holding station for holding a quantity of solar cells available for assembly, a pre-assembly cell inspection station for inspecting and passing or rejecting individual cells for further assembly, and a rejected cell holding area. There is included a tabbing material supply station for holding and supplying a continuous length of tabbing material for making tabs, with a tab cut and crimp station for cutting and crimping the tabbing material into pairs of tabs for interconnected the cells.

There is a string assembly station for assembling the cells and tabs into a string. There is a transport mechanism configured with a cell pick and move tool head for picking up and moving cells through the pre-assembly cell inspection station and placing them in sequence into either the string assembly station or the rejected cell holding area. There is a tab transfer tool for moving pairs of cut and crimped tabs in sequence into the string assembly station.

There is also a horizontally movable platen with individual cell gripping fixtures for moving the string from the string assembly station along a process path terminating at a post assembly string handling station. There is a soldering station in the string line or process path consisting of, in sequence, a preheat zone, a soldering zone and a cooling zone. There may be at least one post assembly string inspection station incorporated with the post assembly string handling station. There is a rejected string holding area and an accepted string holding area incorporated with the post assembly string handling station.

The platen is configured on linear rails with step controllers for indexing the string in increments of a predetermined cell pitch along the process path from the string assembly station through the soldering section to a post assembly string holding area in the post process string handling station. The post process string handling station is configured with a vertically, horizontally and rotably movable string handling tool for gripping and moving the strings from the post assembly holding area to the post assembly string inspection station, and from there to either the good string holding area or the rejected string holding area.

The cell holding station may have a conveyor belt for holding and sequentially moving trays of cells to within reach of the cell pick and move tool head. The pre-assembly inspection station may have or be a vision inspection station with at least one camera and a computer. The preheat and/or the soldering zones of the soldering station may use heat lamp assemblies. The cooling zone may use a pair of opposing air knife nozzles and a return air duct. The zones of the soldering station may be partitionable between indexing movements by extending retractable zone wall panels into position close to the string.

The post assembly string inspection station may use a bank of lamps, where the string handling mechanism is configured to, in sequence, grip a completed string, deactivate the gripping fingers of the cell nest fixtures, lift and rotate the string into inspection position in front of the bank of lamps for operator visual or automated camera inspection.

The cell pick and move tool heads may use a dual Bernoulli chuck configured with multiple vacuum cups. The tabbing material supply station may have two laterally spaced tabbing material feed reels aligned for feeding two parallel strips of said tabbing material into the tab cut and crimp station. The tab transfer tool may have suction ports for holding the tabs for transfer from the tab cut and crimp station to the string assembly station.

The string assembly station may be configured with a tab tail support and a cell support having complimentary structures and linkage and surface areas such that both may occupy a cell support position at the same time, in order to provide for the hand off or transfer of tab tail support from one structure in preparation for receiving the next cell and tab set. The tab tail support is configured for sequential movement from an adjacent tab tail support position forward to said cell support position and downward to a first retracted position below said cell support position and aft to a second retracted position below the normal tab tail support position and upward to the normal tab tail support position. The cell support is configured for sequential movement from the cell support position downward to the first retracted position and upward to the normal cell support position. The linkages and movements of the two supports are synchronized so as to have the cell support move down and remaining at the first retracted position while the tab tail support moves forward from the tab tail support position to the cell support position, and to have the cell support move up and remain at the cell support position while the tab tail support moves from the cell support position downward to the first retracted position and aft to the second retracted position and up to its normal tab tail support position.

The string assembly station is serviced alternately by the cell pick and move tool depositing another solar cell on top of the tab tails of the previous cycle, and the tab transfer tool depositing a new pair of tabs atop the new cell, with tab tails extending aft of the cell for the next cycle.

The tab tail support may be configured to engage a locking lug with the platen upon moving from the second retracted position to the tab tail support position, to remain interlockingly engaged while being moved by a platen indexing movement from the tab tail support position to the cell support position, and to disengage from the platen as it is moving from there to the first retracted position.

The cell gripping fixtures are configured as adjacent pairs of opposing fixtures, where each fixture has multiple sets of vertically oriented pincer action fingers, and each fixture is configured for movement upon actuation from a retracted position to an extended position and for closing of its fingers to a gripping position on opposing edges of a solar cell in the cell support position. Each fixture is lockable in the extended position and the gripping position by engagement of a locking pin, and releasable from the gripping position and the extended position by disengagement of the locking pin. The vertical locking pin be biased with an unlocking spring but may be secured against the unlocking spring in the locking position by simple retraction pressure of a horizontal return spring. A nudge forward on the fixture will unload the horizontal retraction pressure and permit the locking pin to disengage. Alternatively, the locking pin may be configured for self engagement when fixtures are moved to the extended and gripping position. There is an actuator linkage for causing movement of the proximate pair of opposing cell nest fixtures at the string assembly station to the extended and gripping position in coordination with each platen indexing movement.

The string handling tool may have a string-long frame with sets of vacuum ports spaced at cell pitch distance for gripping all cells of a string and maintaining cell alignment within the string during post assembly string handling. The post assembly string handling station includes a deactivating linkage for string releasing of completed strings simultaneously or immediately after gripping by the string handling tool. The deactivating linkage is engagable with all cell nest fixtures simultaneously for releasing their respective locking pins.

The post assembly string inspection station may have electrical contacts and sensors for electrical testing of the string. There may be a post assembly cell inspection station between the soldering station and the post assembly string handling station for sequential inspection of cells of a string during assembly.

As noted above, the invention extends to other than conventional solar cells and tabs. For example, there is a machine for the automated assembly of wafers and electrical connectors into electrically connected strings of wafers, consisting of a control system, a wafer loader incorporating a wafer inspection station for rejecting bad wafers and accepting good wafers, and a connector loader, both loaders being coordinated and controlled by the control system. There is a string assembly station for sequentially receiving and assembling good wafers and connectors from the wafer loader and the connector loader, where the string assembly station coordinated and controlled by said control system.

There is a string-long platen configured with adjacent pairs of individual wafer, multiple finger, opposing edge grippers. The platen is configured for sequential indexing movements of wafer pitch distance out from the string assembly station and through a soldering station, where the soldering station is organized in sequence with a preheat zone, a soldering zone and a cooling zone. The zones are spaced a wafer pitch distance apart The platen and the grippers are coordinated and controlled by the control system. The soldering station is coordinated and controlled for preheating, soldering and cooling of wafer and connector connections by the control system.

There is a string unloader for receiving and removing a completed string of wafers from the platen grippers and placing the strings in either a good string or bad string holding area. The string unloader incorporates a string inspection station for distinguishing good strings from bad strings, and the string unloader is coordinated and controlled by the control system.

The string assembly station consists of a wafer support positionable in a primary supporting position and a connector support positionable in an adjacent starting position, where the wafer support is vertically retractable after respective said opposing edge wafer grippers are actuated, and the connector support is engagable with the platen for horizontal forward motion during indexing movement into the primary supporting position, and where the wafer support and the connector support are vertically interchangable in their respective positions and the connector support is then returnable to its adjacent starting position.

The connector loader may include a bulk connector material dispenser and connector cutter. The preheat and soldering zones may use heat lamp assemblies. The cooling zone may use a pair of opposing air knife nozzles and a return air duct.

Each of the pairs of individual wafer multiple finger opposing edge grippers may consist of opposing side wafer nest fixtures configured with multiple sets of vertically operable pincer action fingers, where each fixture is configured for movement from a retracted position to an extended position and for closing its fingers to a gripping position on the edge of a wafer.

Of course, the wafers may be solar cells, the bulk connector material may be electrically conductive tabbing material, preferably on reels, the connectors may be tabs, and the connector loader may be configured for loading a pair of tabs in sequence with the wafer loader loading solar cells.

Other and various embodiments within the scope of the invention will be readily evident to practitioners skilled in the art, from the specification, figures, and claims that follow.

What is claimed is:

1. A machine for the automated assembly of solar cells into strings, comprising:
   a computerized control system,
   an operator interface,
   a cell holding station for holding a quantity of said solar cells available for assembly,
   a pre-assembly cell inspection station for inspecting and passing or rejecting individual cells for further assembly,
   a rejected cell holding area,
   a tabbing material supply station for holding and supplying a continuous length of tabbing material for making tabs,
   a tab cut and crimp station for cutting and crimping said tabbing material into tabs,
   a string assembly station for assembling said cells and said tabs into a string,
   a transport mechanism configured with a cell pick and move tool head for picking up and moving said cells through said pre-assembly cell inspection station and placing said cells in sequence into one of said string assembly station and said rejected cell holding area,
   a tab transfer tool for moving pairs of said tabs in sequence into said string assembly station,
   a horizontally movable platen with individual cell gripping fixtures for moving said string from said string assembly station along a process path terminating at a post assembly string handling station,
   a soldering station in said process path comprising in sequence a preheat zone, a soldering zone and a cooling zone, at least one post assembly string inspection station incorporated with said post assembly string handling station, a rejected string holding area incorporated with said post assembly string handling station, an accepted string holding area incorporated with said post assembly string handling station, said platen configured on linear rails with step controllers for indexing said string in increments of cell pitch along said process path from said string assembly station through said soldering section to a post assembly string holding area in said post assembly string handling station, said post assembly string handling station configured with a vertically, horizontally and rotably movable string handling tool for gripping and moving individual said strings from said post assembly string holding area to said post assembly string inspection station and from there to one of said accepted string holding area and said rejected string holding area.

2. A machine for the automated assembly of solar cells into strings according to claim 1, said preheat zone of said soldering station comprising a heat lamp assembly.

3. A machine for the automated assembly of solar cells into strings according to claim 2, said soldering zone of said soldering station comprising a heat lamp assembly and temperature sensor.

4. A machine for the automated assembly of solar cells into strings according to claim 3, said cooling zone of said soldering station comprising a pair of opposing air knife nozzles and a return air duct.

5. A machine for the automated assembly of solar cells into strings according to claim 1, said at least one post assembly string inspection station comprising a bank of lamps, said string handling tool configured in sequence to grip a completed said string, deactivate said individual cell gripping fixtures, and lift and rotate said string into inspection position in front of said bank of lamps.

6. A machine for the automated assembly of solar cells into strings according to claim 1, said tabbing material supply station comprising two laterally spaced tabbing material feed reels aligned for feeding two parallel strips of said tabbing material into said tab cut and crimp station.

7. A machine for the automated assembly of solar cells into strings according to claim 6, said tab cut and crimp station comprising a tabbing material clamp, tab die, cutting member, and tab tap.

8. A machine for the automated assembly of solar cells into strings according to claim 7, said tab transfer tool comprising said tab tap configured with suction ports for holding said tabs for transfer from said tab cut and crimp station to said string assembly station.

9. A machine for the automated assembly of solar cells into strings according to claim 1, said string assembly station comprising a tab tail support and a cell support having complimentary structures, linkage and surface areas such that both may occupy a cell support position at the same time, said tab tail support configured for sequential movement from a tab tail support position forward to said cell support position and downward to a first retracted position below said cell support position and aft to a second retracted position below said tab tail support position and upward to said tab tail support position, said cell support configured for sequential movement from said cell support position downward to said first retracted position and upward to said cell support position, said movements synchronized so as to have said cell support remaining at said first retracted position while said tab tail support moves forward from said tab tail support position to said cell support position and to have said cell support remaining at said cell support position while said tab tail support moves from said cell support position downward to said first retracted position and aft to said second retracted position.

10. A machine for the automated assembly of solar cells into strings according to claim 9, said string assembly station being serviced alternately by said tab transfer tool depositing a pair of said tabs and said cell pick and move tool depositing a said solar cell.

11. A machine for the automated assembly of solar cells into strings according to claim 9, said tab tail support configured to interlockingly engage with said platen upon moving to said tab tail support position, to remain interlockingly engaged while moving with a platen indexing movement from said tab tail support position to said cell support position, and to disengage from said platen prior to moving to said first retracted position.

12. A machine for the automated assembly of solar cells into strings according to claim 11, said cell gripping fixtures configured as adjacent pairs of opposing fixtures, each said fixture comprising multiple sets of vertically oriented pincer action fingers, each said pair of opposing fixtures configured for movement from a retracted position to an extended position and for closing said fingers to a gripping position on opposing edges of a solar cell.

13. A machine for the automated assembly of solar cells into strings according to claim 12, said gripping position on opposing edges of a solar cell comprising placement of said fingers on said tabs whereby said tabs are secured to said cell as previously placed by said tab tail support.

14. A machine for the automated assembly of solar cells into strings according to claim 12, each said cell gripping fixture being lockable in said extended position and said gripping position by engagement of a locking pin, and releasable from said gripping position and said extended position by disengagement of said locking pin.

15. A machine for the automated assembly of solar cells into strings according to claim 14, said locking pin configured for self engagement when said fixtures are moved to said extended position and said gripping position.

16. A machine for the automated assembly of solar cells into strings according to claim 15, further comprising actuator linkage for causing said movement of a said pair of opposing fixtures at said string assembly station to said extended position and said gripping position in coordination with each said platen indexing movement.

17. A machine for the automated assembly of solar cells into strings according to claim 14, said string handling tool comprising a string-long frame with vacuum ports for gripping all cells of a string and maintaining cell alignment within the string.

18. A machine for the automated assembly of solar cells into strings according to claim 17, said post assembly string handling station comprising a deactivating linkage for string releasing of completed strings simultaneously, said deactivating linkage engageable with all said fixtures simultaneously for releasing respective locking pins.

19. A machine for the automated assembly of solar cells into strings according to claim 1, further comprising a post assembly cell inspection station between said soldering station and said post assembly string handling station for sequential inspection of cells of a string during assembly.

20. A machine for the automated assembly of solar cells into strings according to claim 1, said post assembly string inspection station comprising electrical contacts and sensors for electrical testing of said string.

21. A machine for the automated assembly of wafers and electrical connectors into electrically connected strings, comprising
- a control system,
- a wafer loader, said wafer loader incorporating a wafer inspection station for rejecting bad wafers and accepting good wafers, said wafer loader being coordinated and controlled by said control system,
- a connector loader coordinated and controlled by said control system,
- a string assembly station for sequentially receiving an assembly of good wafers and connectors from said wafer loader and said connector loader, said string assembly station coordinated and controlled by said control system,
- a string-long platen configured with adjacent pairs of individual wafer multiple finger opposing edge grippers, said platen configured for sequential indexing movements of wafer pitch distance from said string assembly station and through a soldering station, said soldering station comprising in sequence a preheat zone, a soldering zone and a cooling zone, said zones spaced a wafer pitch distance apart, said platen and said grippers being coordinated and controlled by said control system, said soldering station being coordinated and controlled for preheating, soldering and cooling of wafer and connector connections by said control system,
- a string unloader for removing a completed string from said platen and placing the string in one of a good string holding area and a bad string holding area, said string unloader incorporating a string inspection station for distinguishing good strings from bad strings, said string unloader being coordinated and controlled by said control system.

22. A machine for the automated assembly of wafers and electrical connectors according to claim 21, said string assembly station comprising
- a wafer support vertically movable between a primary supporting position and a retracted lower position, and
- a connector support horizontally movable when said wafer support is in said retracted position from a starting position adjacent said primary supporting position to said primary supporting position, said wafer support when in said retracted position and said connector support when in said primary supporting position being vertically interchangable in their respective positions, said connector support when in said retracted lower position and when said wafer support is in said primary supporting position being movable from said retracted lower position to said starting position.

23. A machine for the automated assembly of wafers and electrical connectors according to claim 21, said connector loader including a bulk connector material dispenser and connector cutter.

24. A machine for the automated assembly of wafers and electrical connectors according to claim 21, said preheat zone and said soldering zone of said soldering station each comprising a heat lamp assembly.

25. A machine for the automated assembly of wafers and electrical connectors according to claim 24, said cooling zone of said soldering station comprising a pair of opposing air knife nozzles and a return air duct.

26. A machine for the automated assembly of wafers and electrical connectors according to claim 21, each said pair of individual wafer multiple finger opposing edge grippers comprising opposing side wafer nest fixtures configured with multiple sets of vertically operable pincer action fingers, each said fixture configured for movement from a retracted position to an extended position and for closing said fingers to a gripping position on the edge of said wafer.

27. A machine for the automated assembly of wafers and electrical connectors according to claim 21, said wafers being solar cells, said connectors comprising electrically conductive tabbing material, said connectors being tabs, said connector loader configured for loading a pair of said tabs in sequence with said wafer loader loading said solar cells.

28. A machine for the automated assembly of solar cells and connecting tabs into electrically connected strings, comprising
- a control system,
- a cell loader incorporating a wafer inspection station for rejecting bad cells and accepting good cells, said cell loader being coordinated and controlled by said control system,
- a tab loader coordinated and controlled by said control system,
- a string assembly station for sequentially receiving an assembly of good cells and tabs from said cell loader and said tab loader, said string assembly station coordinated and controlled by said control system,
- a string-long platen configured with adjacent pairs of individual cell multiple finger opposing edge grippers, said platen configured for sequential indexing movements of cell pitch distance from said string assembly station and through a soldering station, said soldering station comprising in sequence a preheat zone, a soldering zone and a cooling zone, said zones spaced a cell pitch distance apart, said platen and said grippers being coordinated and controlled by said control system, said soldering station being coordinated and controlled for preheating, soldering and cooling of wafer and connector connections by said control system,
- a string unloader for removing a completed string from said platen and said grippers and placing the string in one of a good string holding area and a bad string holding area, said string unloader incorporating a string inspection station for distinguishing good strings from bad strings, said string unloader being coordinated and controlled by said control system,
- said tab loader including a bulk tabbing material dispenser and tab crimp and cutter,
- said string assembly station comprising
  - a cell support vertically movable between a primary supporting position and a retracted lower position, and
  - a tab tail support horizontally movable when said cell support is in said retracted position from a starting position adjacent said primary supporting position to said primary supporting position, said cell support when in said retracted position and said tab tail support when in said primary supporting position being vertically interchangable in their respective positions, said tab tail support when in said retracted lower position and when said cell support is in said primary supporting position being movable from said retracted lower position to said starting position,
- said preheat zone and said soldering zone of said soldering station each comprising a heat lamp assembly, said cooling zone of said soldering station comprising a pair of opposing air knife nozzles and a return air duct,
- each said pair of individual cell multiple finger opposing edge grippers comprising opposing side cell nest fixtures configured with multiple sets of vertically operable pincer action fingers, each said fixture configured for movement from a retracted position to an extended position and for closing said fingers to a gripping position on the edge of said cell.

29. A device for providing critical alignment of electrical connectors to wafers during assembly of wafers into electrically connected strings comprising:

a connector cut and crimp station for cutting and crimping said electrical connector material into connectors, an electrical connector material supply station supplying a continuous length electrical connector material to said connector cut and crimp station, a string assembly station for assembling said wafers and said connectors into a string, a wafer transport mechanism for placing wafers in sequence into said string assembly station, a connector transfer tool for moving said connectors in sequence from said cut and crimp station into said string assembly station, a string transport mechanism configured for gripping respective assembled wafers in sequence at said wafer assembly station and indexing them out of said string assembly station, said connector cut and crimp station comprising a connector crimping die, cutting member, and connector tap, said connector tap configured with suction ports for holding cut and crimped said connectors for transfer and precise placement from said connector cut and crimp station into said string assembly station.

30. A device for providing critical alignment of electrical connectors to wafers during assembly of wafers into electrically connected strings according to claim 29, said string assembly station comprising a connector tail support and a wafer support having complimentary structures, linkage and surface areas such that both may occupy a wafer support position at the same time, wherein each has a sufficient surface area to support a said wafer and trailing edge of said connector, said connector tail support configured for sequential movement from a connector tail support position adjacent said wafer support position forward to said wafer support position and downward to a first retracted position below said wafer support position and aft to a second retracted position below said connector tail support position and upward to said connector tail support position, said wafer support configured for sequential movement from said wafer support position downward to said first retracted position and upward to said wafer support position, said movements of said connector tail support and said wafer support synchronized so as to have said wafer support remaining at said first retracted position while said connector tail support moves forward from said connector tail support position to said wafer support position and to have said wafer support remaining at said wafer support position while said connector tail support moves from said wafer support position downward to said first retracted position and aft to said second retracted position.

31. A device for maintaining critical alignment of electrical connectors to wafers and of wafer alignment within a string during assembly of wafers into electrically connected strings comprising:

a string assembly station for assembling connectors to adjacent wafers so as to electrically connect opposing sides of said wafers, a wafer transport mechanism for placing wafers into position in said string assembly station, a horizontally movable platen configured with individual wafer gripping fixtures arranged as adjacent pairs of opposing fixtures, each said fixture comprising multiple sets of vertically oriented pincer action fingers, each said pair of opposing fixtures configured for movement from a retracted apart position to an extended together position and for closing said fingers to a gripping position on opposing edges of an assembled said wafer in said string assembly station, said platen further configured for indexing the resulting said string out of said string assembly station for further processing as each sequential wafer is assembled, said pincer action fingers holding said connectors in contact with said wafers, said individual wafer gripping fixtures secured to said platen so as to maintain the position of each assembled said wafer within said string.

32. A device for maintaining critical alignment of electrical connectors to wafers and of wafer alignment within a string during assembly of wafers into electrically connected strings according to claim 31, each said pair of opposing fixtures being individually operable for extending and gripping; all said pairs of opposing fixtures being collectively operable for ungripping and retracting.

* * * * *